United States Patent
Ishimi

(10) Patent No.: US 7,233,186 B2
(45) Date of Patent: Jun. 19, 2007

(54) CLOCK GENERATION CIRCUIT CAPABLE OF SETTING OR CONTROLLING DUTY RATIO OF CLOCK SIGNAL AND SYSTEM INCLUDING CLOCK GENERATION CIRCUIT

(75) Inventor: Koichi Ishimi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/682,166

(22) Filed: Oct. 10, 2003

(65) Prior Publication Data

US 2004/0232967 A1    Nov. 25, 2004

(30) Foreign Application Priority Data

May 23, 2003    (JP)    ............... 2003-146507

(51) Int. Cl.
*G06F 1/04* (2006.01)
(52) U.S. Cl. .................... 327/291; 327/295
(58) Field of Classification Search ............... 327/291, 327/295, 281, 279, 278, 277, 276, 261–264; 331/57, 34, 25, 17, DIG. 2; 375/373–376
See application file for complete search history.

(56) References Cited

U.S. PATENT DOCUMENTS

| 5,406,590 | A | | 4/1995 | Miller et al. ............... 375/376 |
| 5,519,344 | A | * | 5/1996 | Proebsting ................ 327/108 |
| 5,771,264 | A | * | 6/1998 | Lane ......................... 375/376 |
| 5,815,042 | A | * | 9/1998 | Chow et al. ................ 331/57 |
| 6,389,091 | B1 | * | 5/2002 | Yamaguchi et al. ........ 375/376 |
| 6,501,307 | B1 | * | 12/2002 | Yen ........................... 327/113 |
| 2001/0027503 | A1 | * | 10/2001 | Yamato et al. ............. 710/126 |
| 2004/0247066 | A1 | * | 12/2004 | Suda ......................... 375/376 |

FOREIGN PATENT DOCUMENTS

| JP | 62-42613 | 2/1987 |
| JP | 4-12842 | 3/1992 |
| JP | 6-164379 | 6/1994 |
| WO | WO 85/02275 | 10/1984 |

OTHER PUBLICATIONS

Kouichi Ishimi et al., "A Full-Digital PLL for Low Voltage LSIs", Technical Report of IEICE, ED97-45, SDM97-23, ICD97-35, pp. 29-36, Jun. 1997.

Michel Combes et al., "A Portable Clock Multiplier Generator Using Digital CMOS Standard Cells", IEEE Journal of Solid-State Circuits, vol. 31, No. 7, pp. 958-965, Jul. 1996.

* cited by examiner

*Primary Examiner*—Linh My Nguyen
(74) *Attorney, Agent, or Firm*—McDermott Will & Emery

(57) ABSTRACT

A clock generation circuit receives a reference clock signal for outputting clock signals to peripheral circuits. A duty ratio of at least one of output buffer signals output from buffer circuits included in the clock generation circuit is varied so that a duty ratio of at least one of the clock signals can be varied.

39 Claims, 10 Drawing Sheets

TH>TL

CLOCK GENERATION CIRCUIT CAPABLE OF SETTING OR CONTROLLING DUTY RATIO OF CLOCK SIGNAL AND SYSTEM INCLUDING CLOCK GENERATION CIRCUIT

BACKGROUND OF THE INVENTION

1. Field of the Invention

The present invention relates to a clock generation circuit and a system including the same, and more particularly to a clock generation circuit generating a dock signal having a duty ratio that can be set or controlled, and a system including the clock generation circuit.

2. Description of the Background Art

In an LSI (Large Scale Integration) or a system using an LSI, clock signals are important signals that are required for synchronization with internal elements, internal modules or external devices. Internal elements, internal modules or external devices perform operations or communications in synchronization with rising edges or falling edges of clock signals.

In a conventional clock generation circuit generating a clock signal, the duty ratio of the clock signal is fixed, for example, at 50%.

When a workload of a circuit receiving a clock signal is different between an H (logic high) level duration and an L (logic low) level duration, the operational frequency of the circuit is determined in accordance with the period of time during which the workload is heavier, thereby decreasing the operational efficiency. Moreover, in this case, the power consumption is abruptly increased when the frequency of the clock signal is higher than a certain level.

In addition, when there are a plurality of circuits receiving clock signals, the current peaks occur at the same timing, resulting in increased noises due to EMI (Electromagnetic Interference) or the like.

In order to solve the aforementioned problems, for example, a duty ratio of a clock signal may be varied. Japanese Patent Laying-Open Nos. 6-164379 and 62-42613 disclose means for varying a duty ratio of a clock signal.

The conventional clock generation circuit disclosed in Japanese Patent Laying-Open No. 6-164379 includes a phase comparator and a frequency controlled voltage generation portion receiving an output of the phase comparator, wherein the duty ratio of the frequency can be arbitrarily set by a capacitance charge/discharge current.

The conventional clock generation circuit disclosed in Japanese Patent Laying-Open No. 62-42613 uses a delay circuit and a logic circuit to increase or decrease a duty ratio for an input clock and to perform a variable fine adjustment of the duty ratio by changing a delay time.

The means for varying a duty ratio of a clock signal, however, is not limited to the means disclosed in the prior art references above. Desirably, the duty ratio of the clock signal can be set flexibly in accordance with the scale or characteristics of the circuit receiving the clock signal.

SUMMARY OF THE INVENTION

An object of the present invention is to provide a clock generation circuit capable of setting or controlling a duty ratio of a clock signal flexibly in accordance with a scale or characteristic of a circuit receiving a clock signal, and a system including the same.

A clock generation circuit in accordance with an aspect of the present invention includes: a frequency-multiplying circuit receiving an input of a reference clock signal and outputting a same or frequency-multiplied clock signal of the reference clock signal; and a buffering portion buffering the clock signal. The buffering portion includes at least one buffer circuit buffering the clock signal such that a logic low period and a logic high period of the clock signal are different from each other.

A clock generation circuit in accordance with another aspect of the present invention includes: a frequency-multiplying circuit receiving an input of a reference clock signal and outputting a same or frequency-multiplied clock signal of the reference clock signal, having a logic high period and a logic low period different from each other; and a buffering portion buffering the clock signal.

A clock generation circuit in accordance with yet another aspect of the present invention includes: a frequency-multiplying circuit receiving an input of a reference clock signal and outputting a same or frequency-multiplied clock signal of the reference clock signal; a waveform generation circuit outputting a duty ratio control signal; and an AND gate receiving the clock signal and the duty ratio control signal. In the duty ratio control signal, a period of time during which both of the clock signal and the duty ratio control signal are logic high is different from the other period of time.

A clock generation circuit in accordance with still another aspect of the present invention includes: a frequency-multiplying circuit receiving an input of a reference clock signal and outputting a same or frequency-multiplied clock signal of the reference clock signal; a waveform generation circuit outputting a duty ratio control signal; and an OR gate receiving the clock signal and the duty ratio control signal. In the duty ratio control signal, a period of time during which both of the clock signal and the duty ratio control signal are logic low is different from the other period of time.

A clock generation circuit in accordance with a further aspect of the present invention includes: a frequency-multiplying circuit receiving an input of a reference clock signal and outputting a same or frequency-multiplied clock signal of the reference clock signal; and a buffering portion buffering the clock signal. The buffering portion includes at least one buffer circuit capable of changing a duty ratio of the clock signal.

A clock generation circuit in accordance with a still further aspect of the present invention includes: a frequency-multiplying circuit receiving an input of a reference clock signal and outputting a same or frequency-multiplied clock signal of the reference clock signal; and a buffering portion buffering the clock signal. The frequency-multiplying circuit can change a duty ratio of the clock signal.

A clock generation circuit in accordance with a still further aspect of the present invention includes: a frequency-multiplying circuit receiving an input of a reference clock signal and outputting a same or frequency-multiplied clock signal of the reference clock signal; a waveform generation circuit generating a duty ratio control signal; and an AND gate receiving the clock signal and the duty ratio control signal. In the duty ratio control signal, a ratio between a period of time during which both of the clock signal and the duty ratio control signal are logic high and the other period of time can be varied.

A clock generation circuit in accordance with a further aspect of the present invention includes: a frequency-multiplying circuit receiving an input of a reference clock signal and outputting a same or frequency-multiplied clock signal of the reference clock signal; a waveform generation circuit generating a duty ratio control signal; and an OR gate receiving the clock signal and the duty ratio control signal.

In the duty ratio control signal, a ratio between a period of time during which both of the clock signal and the duty ratio control signal are logic low and the other period of time can be varied.

A system in accordance with an aspect of the present invention includes: a clock generation circuit outputting a clock signal; a clock controlling circuit controlling a duty ratio of the clock signal using a control signal; and a central processing unit controlling the clock controlling circuit. The clock generation circuit includes a frequency-multiplying circuit receiving an input of a reference clock signal and outputting the clock signal same as or multiplied in frequency of the reference clock signal, and a buffering portion buffering the clock signal. The buffering portion includes at least one buffer circuit capable of changing a duty ratio of the clock signal.

A system in accordance with another aspect of the present invention includes: a clock generation circuit outputting a clock signal; a clock controlling circuit controlling a duty ratio of the clock signal using a control signal; and a central processing unit controlling the clock controlling circuit. The clock generation circuit includes a frequency-multiplying circuit receiving an input of a reference clock signal and outputting the clock signal same as or multiplied in frequency of the reference clock signal, and a buffering portion buffering the clock signal. The frequency-multiplying circuit can change a duty ratio of the clock signal.

A system in accordance with yet another aspect of the present invention includes: a clock generation circuit outputting a clock signal; a clock controlling circuit controlling a duty ratio of the clock signal using a control signal; and a central processing unit controlling the clock controlling circuit. The clock generation circuit includes a frequency-multiplying circuit receiving an input of a reference clock signal and outputting the clock signal same as or multiplied in frequency of the reference clock signal, a waveform generation circuit generating a duty ratio control signal, and an AND gate receiving the dock signal and the duty ratio control signal. In the duty ratio control signal, a ratio between a period of time during which both of the clock signal and the duty ratio control signal are logic high and the other period of time can be varied.

A system in accordance with a further aspect of the present invention includes: a clock generation circuit outputting a clock signal; a clock controlling circuit controlling a duty ratio of the clock signal using a control signal; and a central processing unit controlling the clock controlling circuit. The clock generation circuit includes a frequency-multiplying circuit receiving an input of a reference clock signal and outputting the clock signal same as or multiplied in frequency of the reference clock signal, a waveform generation circuit generating a duty ratio control signal, and an OR gate receiving the clock signal and the duty ratio control signal. In the duty ratio control signal, a ratio between a period of time during which both of the clock signal and the duty ratio control signal are logic low and the other period of time can be varied.

As described above, in accordance with the present invention, a duty ratio of a clock signal can be set or controlled flexibly depending on a scale or characteristic of a circuit receiving the clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
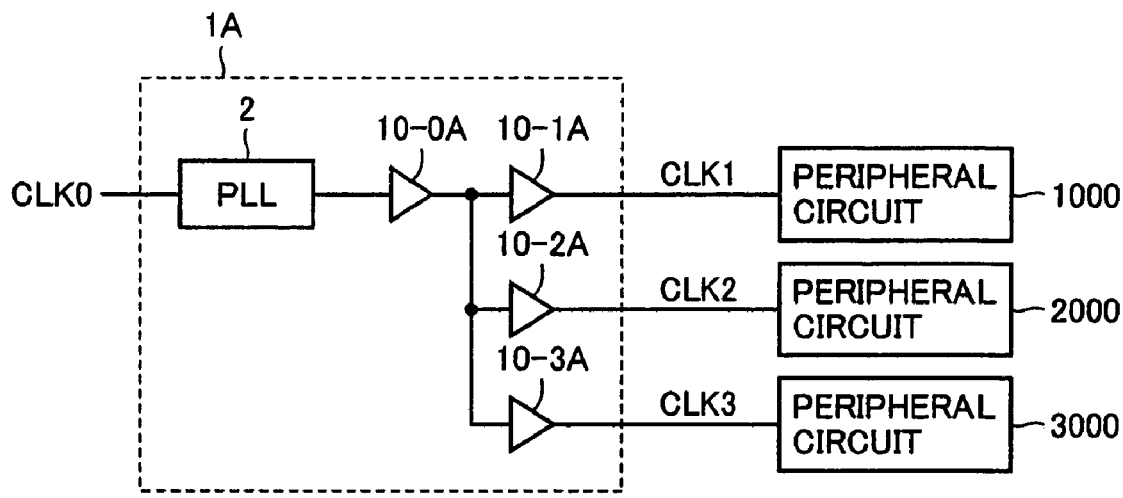
FIG. 1 is a block diagram showing a clock generation circuit 1A and a peripheral circuit thereof in accordance with a first embodiment of the present invention.

In the following, the embodiments of the present invention will be described in detail with reference to the figures. It is noted that in the figures, the same or corresponding parts will be denoted with the same reference characters, and the description thereof will not be repeated.

[First Embodiment]

FIG. 1 is a block diagram showing a clock generation circuit 1A and peripheral circuits thereof in accordance with a first embodiment of the present invention.

Clock generation circuit 1A of the first embodiment shown in FIG. 1 receives a reference clock signal CLK0 to output clock signals CLK1, CLK2, and CLK3 to peripheral circuits 1000, 2000, and 3000, respectively. Here, peripheral circuits 1000, 2000, and 3000 may be a random logic circuit, an operation circuit, a register circuit, a memory circuit, an analog circuit, or the like.

Clock generation circuit 1A includes a PLL (Phase Locked Loop) 2, and buffer circuits 10-0A, 10-1A, 10-2A, and 10-3A. PLL circuit 2 receives a reference clock signal CLK0. Buffer circuit 10-0A receives the output from PLL circuit 2. Buffer circuits 10-1A, 10-2A, 10-3A receive the output of buffer circuit 10-0A to output clock signals CLK1, CLK2, CLK3, respectively.

Clock generation circuit 1A in accordance with the first embodiment is configured to vary the duty ratio of at least one of output buffer signals output from buffer circuits 10-0A, 10-1A, 10-2A, 10-3A so as to vary the duty ratio of the clock signal output from clock generation circuit 1A flexibly.

In the following, exemplary buffer circuit configurations of the first embodiment for forming at least one of buffer circuits 10-0A, 10-1A, 10-2A, 10-3A will be described.

Figure 2:
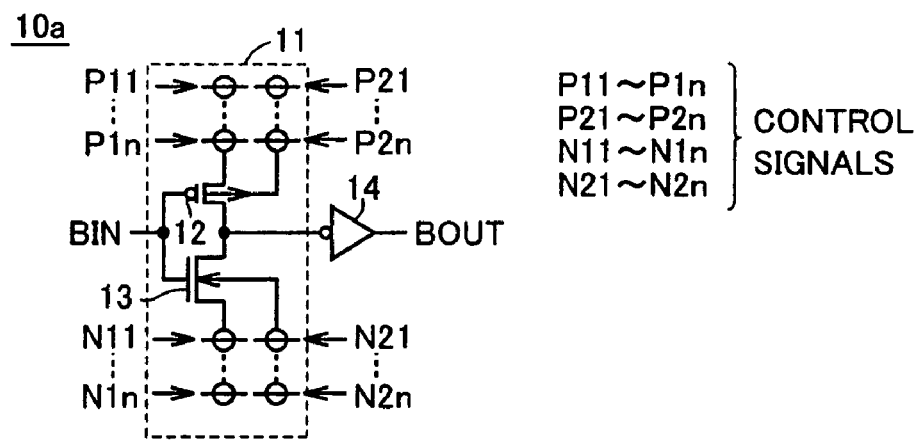
FIG. 2 is a circuit diagram showing a circuit configuration of a buffer circuit 10a in accordance with the first embodiment of the present invention.

FIG. 2 is a circuit diagram showing a circuit configuration of a buffer circuit 10a in accordance with the first embodiment of the present invention.

Buffer circuit 10a of the first embodiment shown in FIG. 2 is formed of inverters 11, 14 of two stages connected in series. Inverter 11 receives an input buffer signal BIN. Inverter 14 receives the output from inverter 11 and outputs an output buffer signal BOUT.

Inverter 11 includes a P-channel MOS transistor 12 and an N-channel MOS transistor 13 connected in series between a power supply node and a ground node. The gates of P-channel MOS transistor 12 and N-channel MOS transistor 13 receive input buffer signal BIN. The drains of P-channel MOS transistor 12 and N-channel MOS transistor 13 are connected to the input terminal of inverter 14.

In buffer circuit 10a of the first embodiment shown in FIG. 2, the gate delay amount for the input signal at N-channel MOS transistor 13 is larger than the gate delay amount for the input signal at P-channel MOS transistor 12. The degree of the gate delay amount depends greatly on the difference in the source-drain current of the MOS transistor.

Figure 3:
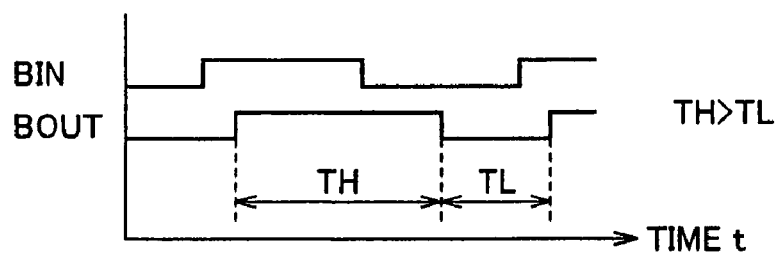
FIG. 3 is an operational waveform diagram illustrating a circuit operation of buffer circuit 10a in accordance with the first embodiment of the present invention.

FIG. 3 is an operational waveform diagram illustrating a circuit operation of buffer circuit 10a in accordance with the first embodiment of the present invention.

Since the gate delay amount for the input signal at N-channel MOS transistor 13 is larger than the gate delay amount for the input signal at P-channel MOS transistor 12, the delay amount of input buffer signal BIN at inverter 11 is larger during the transition from H level to L level than during the transition from L level to H level.

Thus, where the duty ratio of input buffer signal BIN is 50%, output buffer signal BOUT has an H level period TH longer than an L level period TL, as shown in FIG. 3. In the following, it is assumed that the duty ratio of input buffer signal BIN is 50%, unless otherwise specified. In addition, a large/small gate delay amount for an input signal at a transistor is also referred to as a large/small driving capability of a transistor.

In buffer circuit 10a of the first embodiment, although the gate delay amount for the input signal at N-channel MOS transistor 13 is larger, the gate delay amount for the input signal at P-channel MOS transistor 12 may be larger, on the contrary. In this case, output buffer signal BOUT has a longer L level, which is effective for a circuit or a system having a larger amount of operations in the L level period.

In buffer circuit 10a of the first embodiment, although the gate delay amount for the input signal is different between P-channel MOS transistor 12 and N-channel MOS transistor 13 which are included in the former stage, this may be applied to inverter 14 on the latter stage. In this case, the similar effect can be obtained.

As described above, buffer circuit 10a of the first embodiment uses such transistors different in driving capability to vary the duty ratio of the output buffer signal. Therefore, after manufacturing, it becomes difficult to change the duty ratio of the output buffer signal. The buffer circuit that can eliminate such a problem will now be described. In the following, it is assumed that the driving capability is equal among all the transistors included in the circuit, unless otherwise specified.

Figure 4:
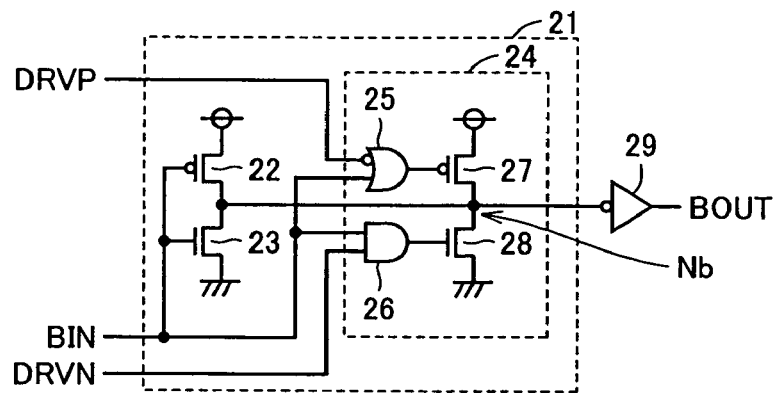
FIG. 4 is a circuit diagram showing a circuit configuration of a buffer circuit 10b in accordance with the first embodiment of the present invention.

FIG. 4 is a circuit diagram showing a circuit configuration of a buffer circuit 10b in accordance with the first embodiment of the present invention.

Buffer circuit 10b of the first embodiment as shown in FIG. 4 is formed of inverters 21 and 29 of two stages connected in series. Inverter 21 includes a P-channel MOS transistor 22 and an N-channel MOS transistor 23 connected in series between a power supply node and a ground node, and a driving capability control circuit 24.

The gates of P-channel MOS transistor 22 and N-channel MOS transistor 23 receive input buffer signal BIN. Inverter 29 receives the input from an output node Nb and outputs output buffer signal BOUT.

Driving capability control circuit 24 includes an OR gate 25 having one input inverted, an AND gate 26, and a P-channel MOS transistor 27 and an N-channel MOS transistor 28 connected in series between the power supply node and the ground node. P-channel MOS transistors 22, 27 are connected in parallel between the power supply node and output node Nb. N-channel MOS transistors 23, 28 are connected in series between output node Nb and the ground node.

OR gate 25 receives input buffer signal BIN and an inverted, driving capability control signal DRVP and has its output connected to the gate of P-channel MOS transistor 27. AND gate 26 receives input buffer signal BIN and a driving capability control signal DRVN and has its output connected to the gate of N-channel MOS transistor 28.

Figure 5:
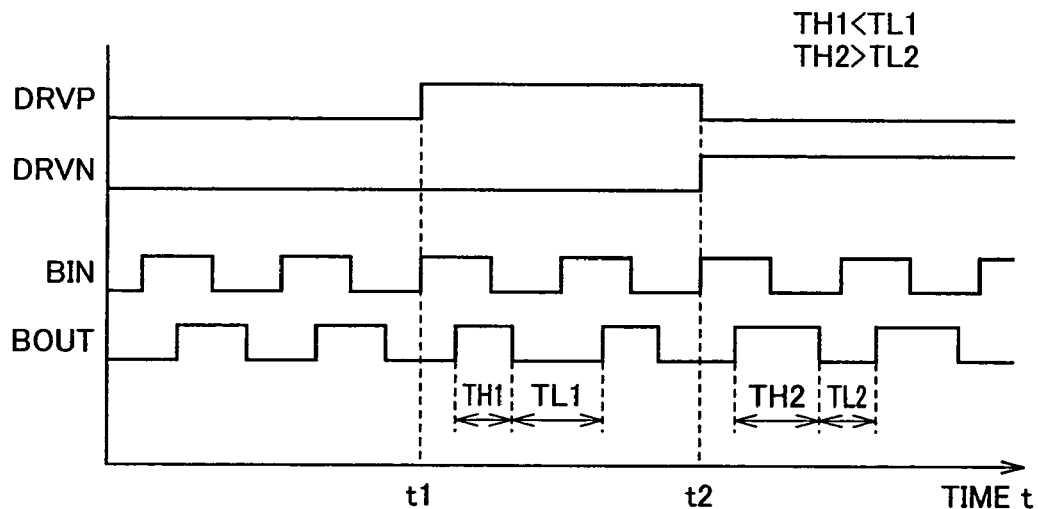
FIG. 5 is an operational waveform diagram illustrating a circuit operation of buffer circuit 10b in accordance with the first embodiment of the present invention.

FIG. 5 is an operational waveform diagram illustrating a circuit configuration of buffer circuit 10b in accordance with the first embodiment of the present invention.

When driving capability control signals DRVP and DRVN both are at L level (prior to time t1), logical gate 25 and AND gate 26 in driving capability control circuit 24 output H level and L level, respectively. As a result, P-channel MOS transistor 27 and N-channel MOS transistor 28 both turn off.

Therefore, in buffer circuit 10b, the driving capability on the side of P-channel MOS transistors 22, 27 becomes equal to that on the side of N-channel MOS transistors 23, 28, prior to time t1. Input buffer signal BIN is thus output as output buffer signal BOUT after being delayed as it is for a certain time period, prior to time t1, as shown in FIG. 5.

When driving capability control signals DRVP, DRVN are at H level, L level, respectively (times t1–t2), the output of logical gate 25 is correlated with the change of input buffer signal BIN, whereas the output of AND gate 26 is always at L level. As a result, P-channel MOS transistors 22, 27 both turn on when input buffer signal BIN is at L level, whereas only N-channel MOS transistor 23 turns on and N-channel MOS transistor remains off when input buffer signal BIN is at H level.

Therefore, at times t1–t2, in buffer circuit 10b, the driving capability in inverter 21 is greater on the side of P-channel MOS transistors 22, 27 than the driving capability on the side of N-channel MOS transistors 23, 28. In other words, the delay amount of input buffer signal BIN at inverter 21 is larger during the transition from L level to H level than during the transition from H level to L level. Therefore, output buffer signal BOUT has an L level period TL1 longer than an H level period TH1 at times t1–t2, as shown in FIG. 5.

When driving capability control signals DRVP, DRVN are at L level, H level, respectively (after time t2), the output of logical gate 25 is always at H level, whereas the output of AND gate 26 is correlated with the change of input buffer signal BIN. As a result, only P-channel MOS transistor 22 turns on and P-channel MOS transistor 27 remains off when input buffer signal BIN is at L level, whereas N-channel MOS transistors 23, 28 both turn on when input buffer signal BIN is at H level.

Therefore, after time t2, in buffer circuit 10b, the driving capability in inverter 21 is greater on the side of the N-channel MOS transistors 23, 28 than on the side of P-channel MOS transistors 22, 27. In other words, the delay amount of input buffer signal BIN at inverter 21 is greater during the transition from H level to L level than during the transition from L level to H level. Therefore, output buffer signal BOUT has an H level period TH2 longer than an L level period TL2, after time t2, as shown in FIG. 5.

In this way, in buffer circuit 10b of the first embodiment, the duty ratio of output buffer signal BOUT can be adjusted by providing driving capability control circuit 25 in inverter 21 and controlling the driving capabilities on the P-channel MOS transistor side and on the N-channel MOS transistor side using driving capability control signals DRVP, DRVN.

Figure 6:
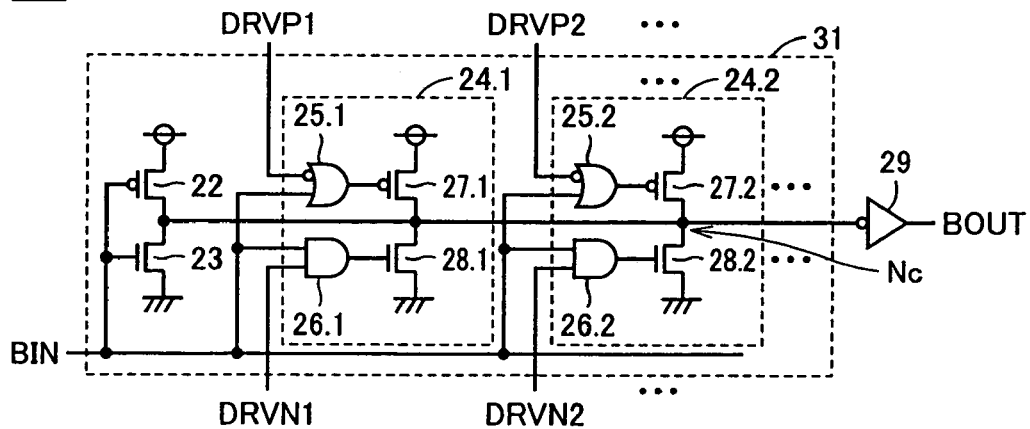
FIG. 6 is a circuit diagram showing a circuit configuration of a buffer circuit 10c in accordance with the first embodiment of the present invention.

FIG. 6 is a circuit diagram showing a circuit configuration of a buffer circuit 10c in accordance with the first embodiment of the present invention.

Buffer circuit 10c shown in FIG. 6 is formed of an inverter 31, which is a replacement of inverter 21 in buffer circuit 10b shown in FIG. 4. Inverter 31 differs from inverter 21 in that driving capability control circuit 24 is provided in multiple stages of driving capability control circuits 24.1, 24.2 . . . etc. Such provision of multiple stages of driving capability control circuit 24 allows a finer adjustment of a duty ratio of output buffer signal BOUT.

Although buffer circuits 10a–10c illustrated in FIGS. 2–6 utilize the difference in the driving capability of transistors to control the duty ratio, the signal delay between inverters may be used to control the duty ratio. Such an embodiment will now be described.

Figure 7:
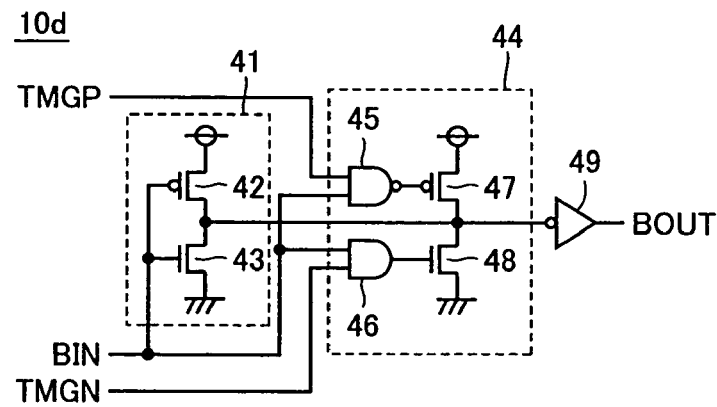
FIG. 7 is a circuit diagram showing a circuit configuration of a buffer circuit 10d in accordance with the first embodiment of the present invention.

FIG. 7 is a circuit diagram showing a circuit configuration of a buffer circuit 10d in accordance with the first embodiment of the present invention.

Buffer circuit 10d of the first embodiment shown in FIG. 7 includes an inverter 41, a timing control circuit 44, and an inverter 49.

Inverter 41 has a P-channel MOS transistor 42 and an N-channel MOS transistor 43 connected in series between a power supply node and a ground node. The gates of P-channel MOS transistor 42 and N-channel MOS transistor 43 receive input buffer signal BIN.

Timing control circuit 44 has an NAND gate 45, an AND gate 46, and a P-channel MOS transistor 47 and an N-channel MOS transistor 48 connected in series between the power supply node and the ground node. NAND gate 45 receives a timing control signal TMGP and input buffer signal BIN and has the output connected to the gate of P-channel MOS transistor 47. AND gate 46 receives a timing control signal TMGN and input buffer signal BIN and has the output connected to the gate of N-channel MOS transistor 48.

Inverter 49 receives the inputs from the drains of P-channel MOS transistors 42, 47 and N-channel MOS transistors 43, 48 and outputs output buffer signal BOUT.

Figure 8:
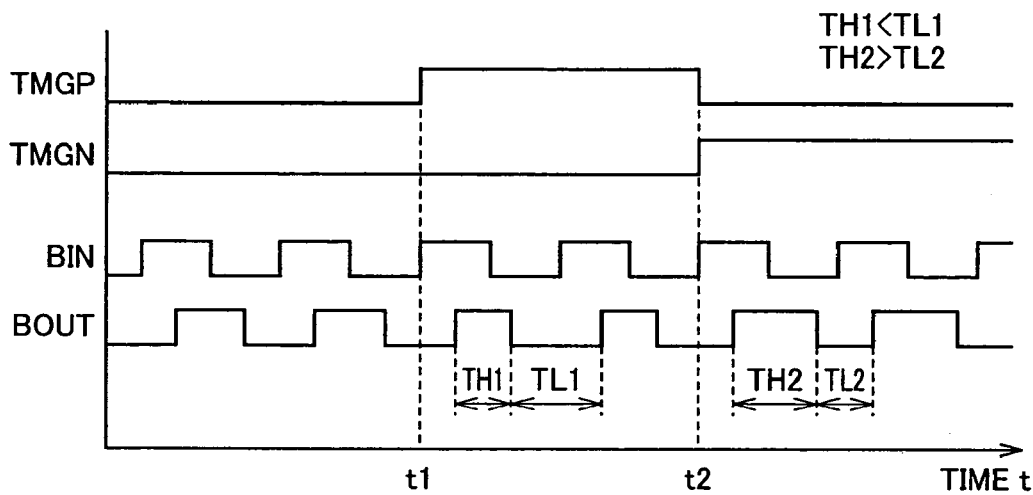
FIG. 8 is an operational waveform diagram illustrating a circuit operation of buffer circuit 10d in accordance with the first embodiment of the present invention.

FIG. 8 is an operational waveform diagram illustrating a circuit operation of buffer circuit 10d in accordance with the first embodiment of the present invention.

When timing control signals TMGP, TMGN both are at L level (prior to time t1), NAND gate 45 and AND gate 46 within timing control circuit 44 output H level and L level, respectively. As a result, P-channel MOS transistor 47 and N-channel MOS transistor 48 both turn off.

Buffer circuit 10d is thus equivalent to inverter 41 and inverter 49 as serially connected. Therefore, input buffer signal BIN is output as output buffer signal BOUT as being delayed as it is for a certain time period, prior to time t1, as shown in FIG. 8.

When timing control signals TMGP and TMGN are at H level and L level, respectively (times t1–t2), respectively, NAND gate 45 outputs L level and H level at the time of H level and L level of input buffer signal BIN, respectively, and AND gate 46 always outputs L level, within timing control circuit 44.

Therefore, when input buffer signal BIN goes to H level, an L level signal is output from inverter 41 to inverter 49, and output buffer signal BOUT initially goes to H level. However, output buffer signal BOUT soon goes to L level, because P-channel MOS transistor 47 in timing control circuit 44 thereafter turns on to provide a power supply potential VCC (H level) to the input of inverter 49.

Thus, when timing control signals TMGP and TMGN are at H level and L level, respectively (times t1–t2), output buffer signal BOUT has an L level period TL1 longer than an H level period TH1, as shown in FIG. 8.

When timing control signals TMGP and TMGN are at L level and H level, respectively (after time t2), in timing control circuit 44, NAND gate 45 always outputs H level and AND gate 46 outputs H level and L level at the time of H level and L level of input buffer signal BIN, respectively.

Therefore, when input buffer signal BIN goes to H level, an L level signal is output from inverter 41 to inverter 49, and output buffer signal BOUT goes to H level. In addition, N-channel MOS transistor 48 in timing control circuit 44 turns on to provide ground potential GND (L level) to the input of inverter 49. When input buffer signal BIN thereafter goes to L level, an H level signal is output from inverter 41 to inverter 49. As N-channel MOS transistor 48 remains off for a while, ground potential GND (L level) is continuously supplied to the input of inverter 49 for a while, and output buffer signal BOUT remains at H level for a while.

Thus, when timing control signals TMGP and TMGN are at L level and H level, respectively (after time t2), output buffer signal BOUT has an H level period TH2 longer than an L level period TL2, as shown in FIG. 8.

In this way, in buffer circuit 10*d* of the first embodiment, the duty ratio of output buffer signal BOUT can be adjusted by inserting timing control circuit 44 between inverter 41 and inverter 49 and controlling a signal delay between the inverters using timing control signals TMGP, TMGN.

Figure 9:
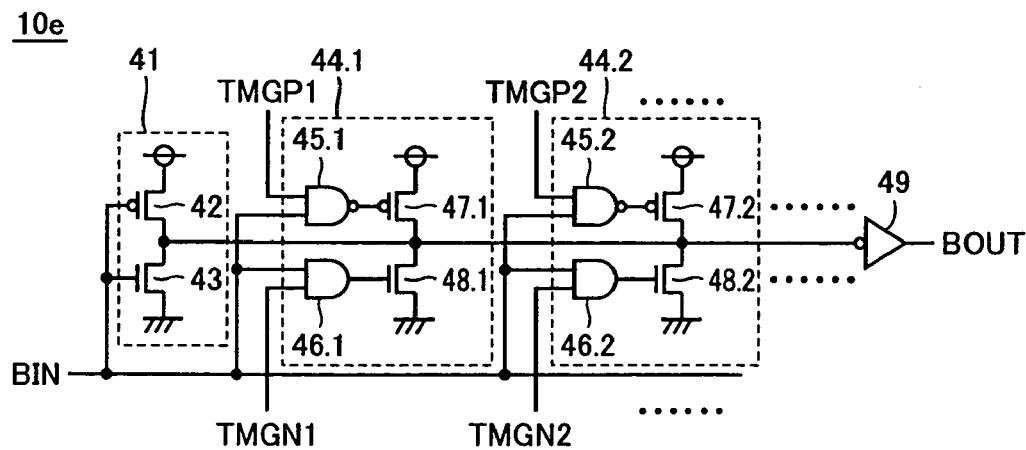
FIG. 9 is a circuit diagram showing a circuit configuration of a buffer circuit 10e in accordance with the first embodiment of the present invention.

FIG. 9 is a circuit diagram showing a circuit configuration of a buffer circuit 10*e* in accordance with the first embodiment of the present invention.

Buffer circuit 10*e* of the first embodiment shown in FIG. 9 is configured such that timing control circuit 44 in buffer circuit 10*d* shown in FIG. 7 is divided in multiple stages of timing control circuits 44.1, 44.2, ... etc. Such provision of multiple stages of timing control circuit 44 allows a finer adjustment of a duty ratio of output buffer signal BOUT.

Figure 10:
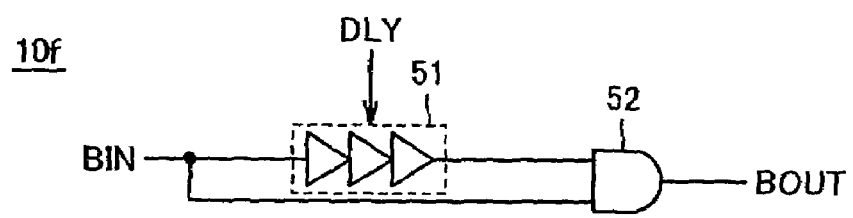
FIG. 10 is a circuit diagram showing a circuit configuration of a buffer circuit 10f in accordance with the first embodiment of the present invention.

FIG. 10 is a circuit diagram showing a circuit configuration of a buffer circuit 10*f* in accordance with the first embodiment of the present invention.

Buffer circuit 10*f* of the first embodiment shown in FIG. 10 includes a delay circuit 51 and an AND gate 52. Delay circuit 51 can control a delay time in accordance with a delay control signal DLY. AND gate 52 receives input buffer signal BIN delayed by delay circuit 51 and input buffer signal BIN not delayed by delay circuit 51, and outputs output buffer signal BOUT.

Figure 11:
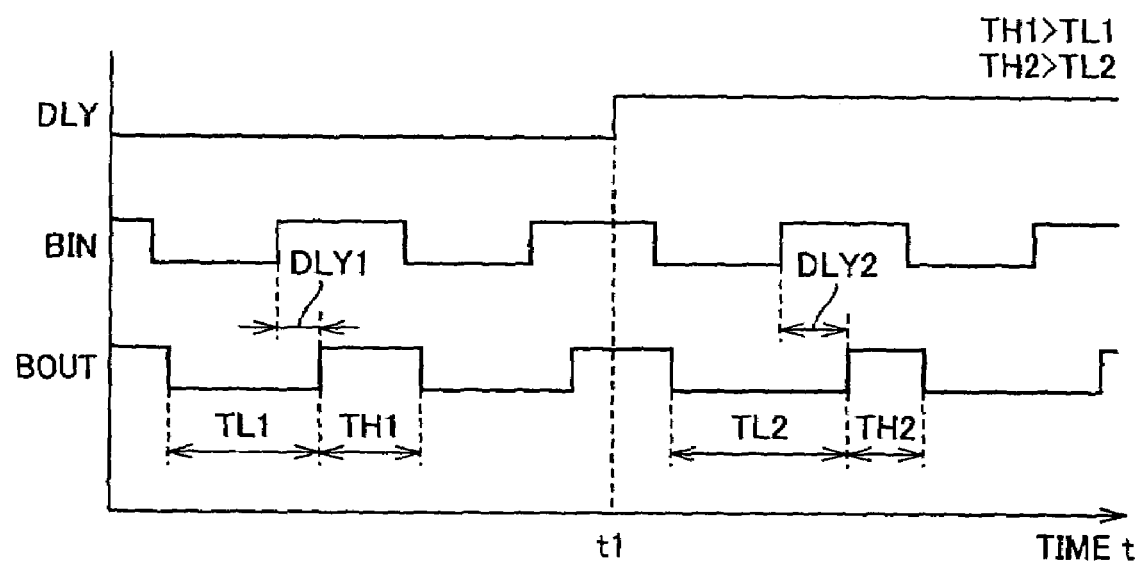
FIG. 11 is an operational waveform diagram illustrating a circuit operation of buffer circuit 10f in accordance with the first embodiment of the present invention.

FIG. 11 is an operational waveform diagram illustrating a circuit operation of buffer circuit 10*f* in accordance with the first embodiment of the present invention. Here, for the sake of brevity, description will be made to a case where delay control signal DLY varies in two levels of H level and L level. This, however, will be described by way of example, and delay control signal DLY can generally be varied in multi-levels or continuously.

When delay control signal DLY is at L level (prior to time t1), delay circuit 51 delays the input signal by a prescribed delay time DLY1. When input buffer signal BIN changes from H level to L level, AND gate 52 has its output changed from H level to L level immediately after receiving input buffer signal BIN not delayed by delay circuit 51. On the other hand, when input buffer signal BIN changes from L level to H level, AND gate 52 has its output unchanged from L level to H level until receiving input buffer signal BIN delayed by delay circuit 51 by delay time DLY1. Therefore, output buffer signal BOUT has an L level period TL1 longer than an H level period TH, prior to time t1, as shown in FIG. 11.

When delay control signal DLY is at H level (after time t1), delay circuit 51 delays the input signal by a prescribed delay time DLY2. Therefore, output buffer signal BOUT has an L level period TL2 longer than an H level period TH, after time T1, as shown in FIG. 11. Since it is assumed that delay time DLY2 is longer than delay time DLY1, the L level period TL2 after time t1 is longer than the L level period TL1 before time t1.

In this way, in buffer circuit 10*f* of the first embodiment, the duty ratio of output buffer signal BOUT can be varied in accordance with the delay control signal by providing a delay circuit having a delay time length that can be controlled by a delay control signal, prior to one input of the AND gate.

Figure 12:
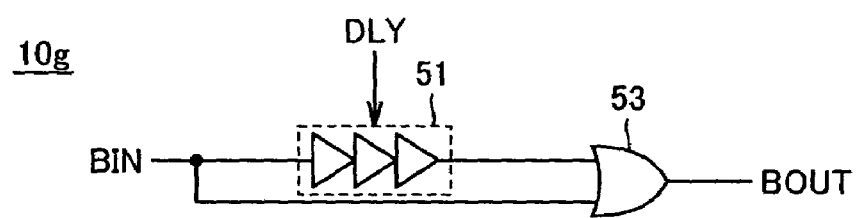
FIG. 12 is a circuit diagram showing a circuit configuration of a buffer circuit 10g in accordance with the first embodiment of the present invention.

FIG. 12 is a circuit diagram showing a circuit configuration of a buffer circuit 10*g* in accordance with a first embodiment of the present invention.

Buffer circuit 10*g* of the first embodiment shown in FIG. 12 includes a delay circuit 51 and an OR gate 53. Delay circuit 51 can control a delay time in accordance with delay control signal DLY. OR gate 53 receives input buffer signal BIN delayed by delay circuit 51 and input buffer signal BIN not delayed by delay circuit 51, and outputs output buffer signal BOUT.

Figure 13:
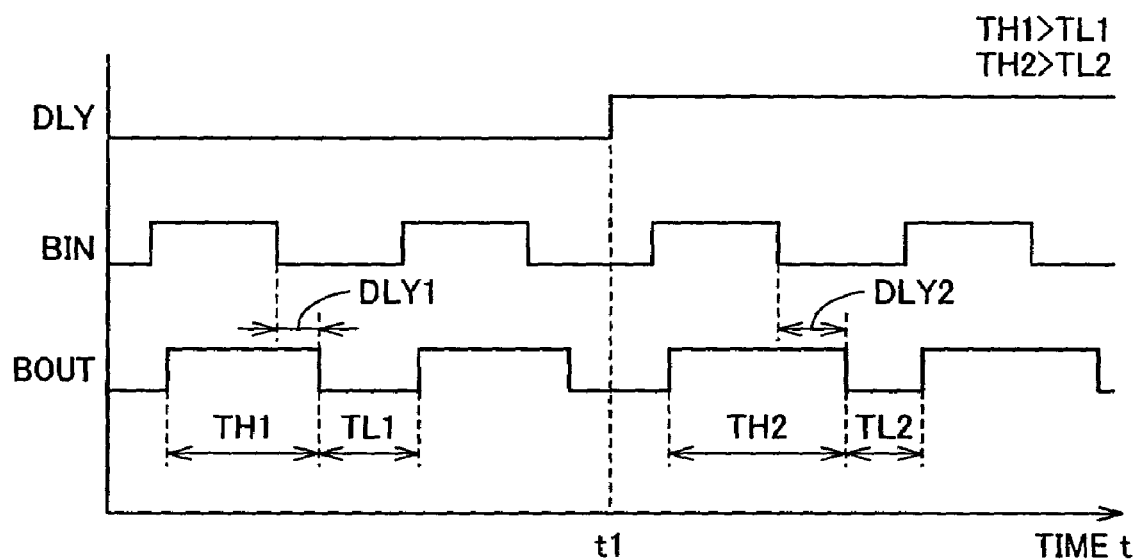
FIG. 13 is an operational waveform diagram illustrating a circuit operation of buffer circuit 10g in accordance with the first embodiment of the present invention.

FIG. 13 is an operational waveform diagram illustrating a circuit operation of buffer circuit 10*g* in accordance with the first embodiment of the present invention. Here, for the sake of brevity, description will be made to a case where delay control signal DLY changes in two levels of H level and L level. This, however, will be described only by way of example, and delay control signal DLY can generally be changed in multi-levels or continuously.

When delay control signal DLY is at L level (prior to time t1), delay circuit 51 delays an input signal by a prescribed delay time DLY1. When input buffer signal BIN changes from L level to H level, OR gate 53 has its output changed from L level to H level immediately after receiving input buffer signal BIN not delayed by delay circuit 51. On the other hand, when input buffer signal BIN changes from H level to L level, OR gate 53 has its output unchanged from H level to L level until receiving input buffer signal BIN delayed by delay time DLY1 by delay circuit 51. Therefore, output buffer signal BOUT has an H level period TH1 longer than an L level period TL, prior to time t1, as shown in FIG. 13.

When delay control signal DLY is at H level (after time t1), delay circuit 51 delays an input signal by a prescribed delay time DLY2. Therefore, output buffer signal BOUT has an H level period TH2 longer than an L level period TL, after time t1, as shown in FIG. 13. Furthermore, the H level period TH2 after time t1 is longer than the H level period TH1 before time t1, since it is assumed that delay time DLY2 is longer than delay time DLY1.

In this way, in buffer circuit 10*g* of the first embodiment, the duty ratio of output buffer signal BOUT can be varied in accordance with the delay control signal by providing a delay circuit having a delay time length that can be controlled by a delay control signal, prior to one input of the OR gate.

In the following, how buffer circuits 10*a*–10*g* of the first embodiment as described above are adapted to buffer circuits 10-0A, 10-1A, 10-2A, 10-3A in clock generation circuit 1A in FIG. 1 will be described based on specific examples.

When the amount of operations during the H level period is large in all of peripheral circuits 1000–3000 receiving clock signals CLK1-CLK3, respectively, for example, the H level period in all of clock signals CLK1-CLK3 can be lengthened by adapting buffer circuits 10a–10g in the first embodiment to buffer 10-0A. Thus, increased speed and reduced power consumption in peripheral circuits 1000–3000 can be realized.

When the amount of operations during the H level period is large only in peripheral circuit 1000 receiving clock signal CLK1, for example, the H level period of dock signal CLK1 can be lengthened only in peripheral circuit 1000 having a large amount of operations in the H level period, by adapting buffer circuits 10a–10g in the first embodiment to buffer 10-1A. As a result, peripheral circuits 1000–3000 as a whole can efficiently be increased in speed and reduced in power consumption.

In this case, since clock signal CLK1 has the falling edge shifted from those of clock signals CLK2, CLK3, peripheral circuit 1000 operating at the falling edge has operation timing also shifted from those of peripheral circuits 2000, 3000. Therefore, the timings of current peak are also shifted in peripheral circuits 1000–3000. Therefore, where clock generation circuit 1A is incorporated into an LSI, for example, the malfunction of LSI due to excess current is less likely to occur and the noise due to EMI can also be reduced.

As described above, the duty ratio of clock signals CLK1, CLK2, CLK3 may be set for all of peripheral circuits 1000–3000 or for a specific one of peripheral circuits 1000–3000. The duty ratio of the clock signal can be set flexibly depending on the system in this manner, so that it is possible to construct a system achieving highest performance for each module.

With reference to FIG. 1, as an example of clock generation circuit 1A in accordance with the first embodiment of the present invention, power supply potential VCC or ground potential GND may be changed only in at least one of buffer circuits 10-0A, 10-1A, 10-2A, 10-3A. In this case, as the logical threshold value of the buffer circuit is shifted, the duty ratio of the output buffer signal can be changed. It is noted that the duty ratio of the output buffer signal can be adjustedusing a control signal (see FIG. 2, signals P11–P1n and N11–N1n) by adjusting the amount of change in power supply potential VCC or ground potential GND using the control signal.

With reference to FIG. 1, as another example of clock generation circuit 1A in accordance with the first embodiment of the present invention, a substrate potential of a transistor included in the buffer circuit may be changed only in at least one of buffer circuits 10-0A, 10-1A, 10-2A, 10-3A. In this case, as the logical threshold value of the buffer circuit is shifted, the duty ratio of the output buffer signal can be changed. It is noted that the duty ratio of the output buffer signal can be adjusted using a control signal (see FIG. 2, signals P21–P2n and N21–N2n) by adjusting the amount of change in substrate potential of the transistor using the control signal.

As described above, in accordance with the first embodiment, increased speed and reduced power consumption of the system including clock generation circuit 1A can be realized by varying the duty ratio of at least one of the output buffer signals output from buffer circuits 10-0A, 10-1A, 10-2A, 10-3A that are components of clock generation circuit 1A.

[Second Embodiment]

Figure 14:
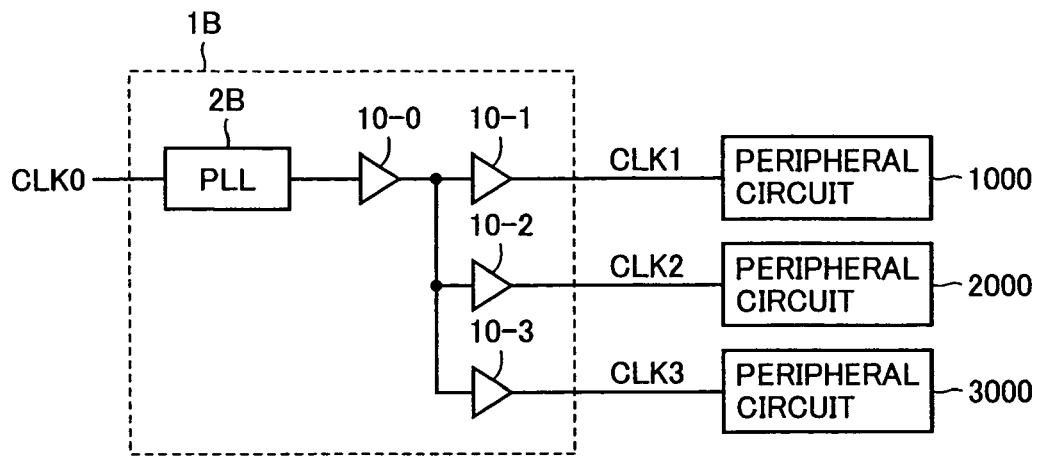
FIG. 14 is a block diagram showing a clock generation circuit 1B and a peripheral circuit thereof in accordance with the second embodiment of the present invention.

FIG. 14 is a block diagram showing a clock generation circuit 1B and peripheral circuits thereof in accordance with a second embodiment of the present invention.

Clock generation circuit 1B of the second embodiment shown in FIG. 14 receives reference clock signal CLK0 to output clock signals CLK1, CLK2, CLK3 to peripheral circuits 1000, 2000, 3000, respectively. Here, peripheral circuits 1000, 2000, 3000 may be, for example, a random logic circuit, an operation circuit, a register circuit, a memory circuit, an analog circuit, or the like.

Clock generation circuit 1B includes a PLL circuit 2B, and buffer circuits 10-0, 10-1, 10-2, 10-3. PLL circuit 2B receives reference clock signal CLK0. Buffer circuit 10-0 receives the output from PLL circuit 2B. Buffer circuits 10-1, 10-2, 10-3 receive the output from buffer circuit 10-0 to output clock signals CLK1, CLK2, CLK3, respectively.

Clock generation circuit 1B of the second embodiment is configured to vary the duty ratio of the output PLL signal output from PLL circuit 2B so as to vary the duty ratio of the clock signal output from clock generation circuit 1B.

In the following, exemplary configurations of the PLL circuit of the second embodiment for forming PLL circuit 2B will be described.

Figure 15:
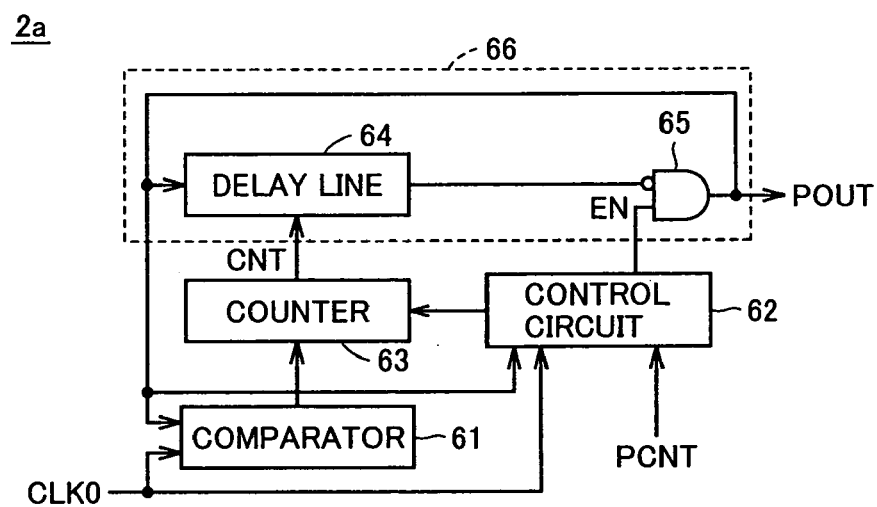
FIG. 15 is a circuit diagram showing a circuit configuration of a PLL circuit 2a in accordance with a second embodiment of the present invention.

FIG. 15 is a circuit diagram showing a PLL circuit 2a in accordance with the second embodiment of the present invention.

PLL circuit 2a of the second embodiment shown in FIG. 15 is a digital PLL circuit, including a comparator 61, a control circuit 62, a counter 63, a delay line 64, and an AND gate 65. The output signal from delay line 64 is inverted and input to one input terminal of AND gate 65.

Delay line 64 and AND gate 65 constitute a ring oscillator 66. Ring oscillator 66 oscillates so that an output PLL signal POUT is output from AND gate 65. Output PLL signal POUT is fed back to delay line 64 and is also input to comparator 61 and control circuit 62.

Comparator 61 compares output PLL signal POUT with reference clock signal CLK0 in phase and outputs the phase comparison result to counter 63.

Control circuit 62 increments/decrements a digital count value CNT output from counter 63 when a count value control signal PCNT is activated. Control circuit 62 also outputs an enable signal EN for controlling the oscillation of ring oscillator 66 to the other input terminal of AND gate 65.

Counter 63 determines digital count value CNT based on the phase comparison result output from comparator 61. Digital count value CNT is incremented/decremented in accordance with an instruction to increment/decrement a digital count value CNT, which is output from control circuit 62 when count value control signal PCNT is activated.

Delay line 64 receives digital count value CNT output from counter 63 to adjust a delay time. Varied delay time at delay line 64 allows the duty ratio of output PLL signal POUT output from AND gate 65 to be varied. Output PLL signal POUT has the same or multiplied frequency of reference clock signal CLK0.

Figure 16:
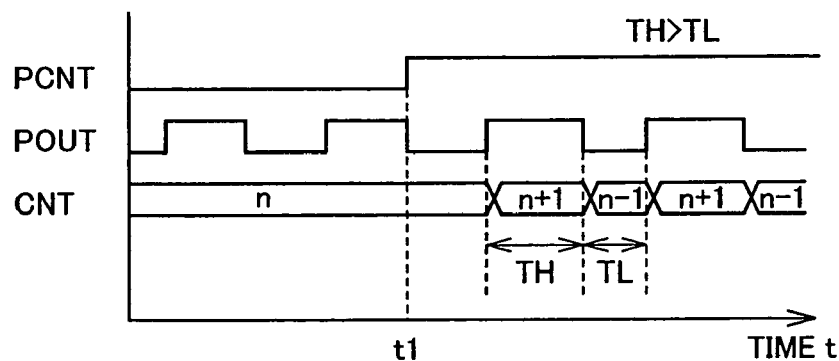
FIG. 16 is an operational waveform diagram illustrating a circuit operation of PLL circuit 2a in accordance with the second embodiment of the present invention.

FIG. 16 is an operational waveform diagram illustrating a circuit operation of PLL circuit 2a in accordance with the second embodiment of the present invention.

When count value control signal is at L level (prior to time t1), control circuit 62 does not output the instruction to increment/decrement digital count value CNT, so that the oscillation state of ring oscillator 66 is stable and digital count value CNT takes a constant value n. At this time, the duty ratio of output PLL signal is 50%.

When count value control signal PCNT is at H level (after time t1), control circuit 62 outputs the instruction to increment/decrement digital count value CNT, and digital count value CNT switches to n+1 at the time of rising and to n+1 at the time of failing of output PLL signal POUT. As a result, the delay time of delay line 64 is long when output PLL signal POUT is at H level, and it is short when POUT is at L level.

Therefore, when count value control signal PCNT is at H level, as shown in FIG. 16, output PLL signal POUT has a longer H level period than an L level period and has the duty ratio changed from 50%. In this manner, in PLL circuit 2a of the second embodiment, the duty ratio of output PLL signal POUT can be adjusted by operating the activation/inactivation of count value control signal PCNT.

In PLL circuit 2a of the second embodiment, digital count value CNT is switched between n+1 and n−1 in accordance with the rising and falling of output PLL signal POUT, though the present invention is not limited thereto. Generally, it can be switched between n+p and n−p (where p is a natural number).

Although the duty ratio of output PLL signal POUT has been described above as being controlled by activation/inactivation of count value control signal PCNT, the duty ratio of output PLL signal POUT may not always be controllable. For example, a constant ratio between the H level period and the L level period of output PLL signal POUT can always be kept by fixing count value control signal PCNT at H level. Here, the ratio between the H level period and the L level period of output PLL signal POUT is stable because the activation/inactivation of count value control signal PCNT is not used.

Figure 17:
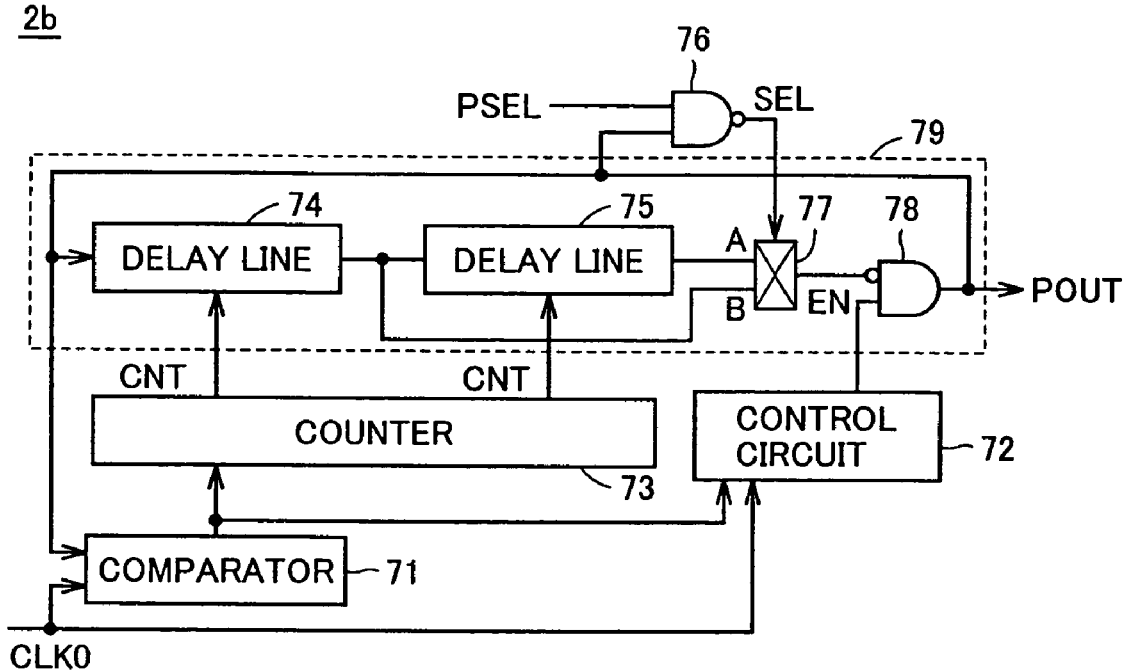
FIG. 17 is a circuit diagram showing a circuit configuration of a PLL circuit 2b in accordance with the second embodiment of the present invention.

FIG. 17 is a circuit diagram showing a circuit configuration of a PLL circuit 2b in accordance with the second embodiment of the present invention.

PLL circuit 2b of the second embodiment shown in FIG. 17 is a digital PLL circuit, including a comparator 71, a control circuit 72, a counter 73, delay lines 74, 75, an NAND gate 76, a selector 77, and an AND gate 78. It is noted that the output signal of selector 77 is inverted and input to one input terminal of AND gate 78.

Delay lines 74, 75, selector 77, and AND gate 78 constitute a ring oscillator 79. Ring oscillator 79 oscillates so that output PLL signal POUT is output from AND gate 78. Output PLL signal POUT is fed back to delay line 74 and is also output to one input terminal of NAND gate 76 and comparator 71.

Comparator 71 compares output PLL signal POUT with reference clock signal CLK0 in phase and outputs the phase comparison result to counter 73. Control circuit 72 outputs enable signal EN for controlling the oscillation of ring oscillator 79 to the other input terminal of AND gate 78. Counter 73 determines digital count value CNT based on the phase comparison result output from comparator 71.

Delay lines 74, 75 receive digital count value CNT output from counter 73 to determine a delay time. The output signal output from delay line 74 is input to delay line 75 and is also input to an input terminal B of selector 77. The output signal output from delay line 75 is input to an input terminal A of selector 77.

NAND gate 76 receives a selector control signal PSEL and an output PLL signal POUT to output a select signal SEL to selector 77. Selector 77 receives a signal from input terminal A at the time of L level of select signal SEL and a signal from input terminal B at the time of H level of select signal SEL, and inverts the signal for input to one input of AND gate 78.

Figure 18:
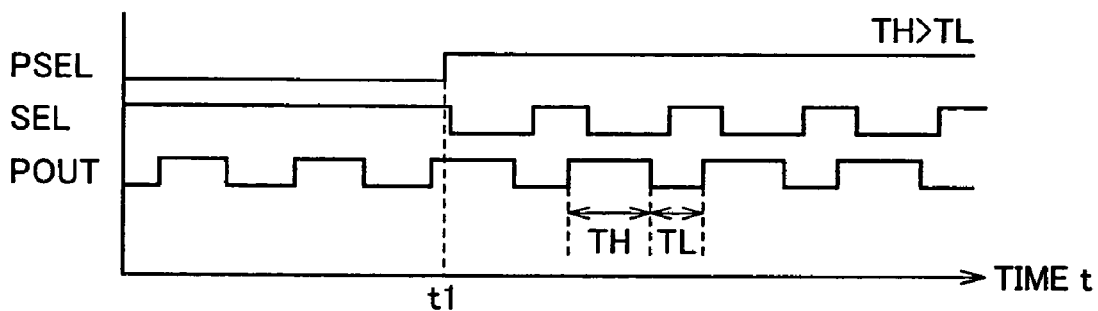
FIG. 18 is an operational waveform diagram illustrating a circuit operation of PLL circuit 2b in accordance with the second embodiment of the present invention.

FIG. 18 is an operational waveform diagram illustrating a circuit operation of PLL circuit 2b in accordance with the second embodiment of the present invention.

When selector control signal SEL is at L level (prior to time t1), select signal SEL is always at H level, irrespective of the state of output PLL signal POUT. Therefore, selector 77 always selects input terminal B without passing through delay line 75. Therefore, ring oscillator 79 is stable and the duty ratio of output PLL signal POUT is 50%.

When selector control signal PSEL is at H level (after time t1), select signal SEL is an inversion signal of output PLL signal POUT. As output PLL signal POUT is at H level at time t1, select signal SEL switches to L level and selector 77 selects input terminal A. As a result, ring oscillator 79 has a longer delay time as not passing through delay line 75.

Thereafter, when output PLL signal goes to L level, select signal SEL switches to H level and selector 77 selects input terminal B. As a result, ring oscillator 79 has a shorter delay time as not passing through delay line 75. Therefore, when selector control signal PSEL is at H level, as shown in FIG. 18, output PLL signal POUT has the H level period longer than the L level period and has the duty ratio changed from 50%.

As described above, in PLL circuit 2b of the second embodiment, the duty ratio of output PLL signal POUT can be adjusted by operating selector control signal PSEL.

Although, the duty ratio of output PLL signal POUT has been described above as being controlled by the activation/inactivation of selector control signal PSEL, the duty ratio of output PLL signal POUT may not always be controllable. A constant ratio between the H level period and the L level period of output PLL signal POUT can always be kept by fixing selector control signal PSEL at H level. Here, the ratio between the H level period and the L level period of output PLL signal POUT is stable because the activation/inactivation of selector control signal PSEL is not used.

In the case of digital PLL circuit such as PLL circuits 2a, 2b of the second embodiment as described above, the digital count value output from the counter is basically determined by the ratio between the cycle of output PLL signal at that time and the gate delay of the transistor included in the digital PLL circuit, namely, "the cycle of output PLL signal/the gate delay". The gate delay is affected by the characteristics of the transistor, which are also affected by variations in manufacturing processes of the transistor, as well as temperatures, voltages, and the like.

Now consider that a circuit operated with output PLL signal from a digital PLL circuit is provided on the same substrate as the digital PLL circuit. When "the cycle of output PLL signal/the gate delay" is small, the circuit operated with the output PLL signal from the digital PLL circuit has a small operational margin with respect to the output PLL signal. It is therefore effective to change the duty ratio of the output PLL signal as necessary. When "the cycle of output PLL signal/the gate delay" is large, the circuit operated with the output PLL signal from the digital PLL circuit has a sufficient operational margin with respect to the output PLL signal. It is thus not so effective if the duty ratio of the output PLL signal is changed. Therefore, the duty ratio of the output PLL signal may be 50%.

Furthermore, consider that the frequency of the output PLL signal output from the digital PLL circuit can be varied by software. When the frequency of the output PLL signal is high, the circuit operated with the output PLL signal from the digital PLL circuit has a small operational margin with respect to the output PLL signal. It is therefore effective to change the duty ratio of the output PLL signal as necessary.

When the frequency of the output PLL signal is low, the circuit operated with the output PLL signal from the digital PLL circuit has a sufficient operational margin with respect to the output PLL signal. It is thus not so effective if the duty ratio of the output PLL signal is changed, and the duty ratio of the output PLL signal may be 50%.

As described above, in accordance with the second embodiment, increased speed and reduced power consumption of the system including clock generation circuit 1B can be realized by varying the duty ratio of output PLL signal POUT output from PLL circuit 2B that is a component of clock generation circuit 1B.

[Third Embodiment]

Figure 19:
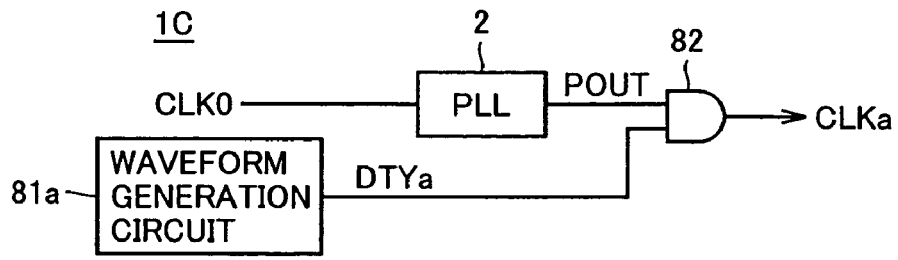
FIG. 19 is a circuit diagram showing a circuit configuration of a clock generation circuit 1C in accordance with a third embodiment of the present invention.

FIG. 19 is a circuit diagram showing a circuit configuration of a clock generation circuit 1C in accordance with a third embodiment of the present invention.

Clock generation circuit 1C of the third embodiment shown in FIG. 19 includes a PLL circuit 2, a waveform generation circuit 81a, and an AND gate 82.

PLL circuit 2 receives the input of reference clock signal CLK0 and outputs output PLL signal POUT that is three times the frequency of reference clock signal CLK0. It is noted that PLL circuit 2 may be an analog PLL circuit, a digital PLL circuit, or any other PLL circuit, and that three times is only an example, and basically, any multiplication rate may be employed. Waveform generation circuit 81a outputs a duty ratio control signal DTYa. AND gate 82 receives the inputs of output PLL signal POUT and duty ratio control signal DTYa to output a clock signal CLKa.

Duty ratio control signal DTYa is a periodic signal having a waveform generated by waveform generation circuit 81 such that the period of time during which both output PLL signal POUT and duty ratio control signal DTYa are at H level is different from that of the other period of time.

Figure 20:
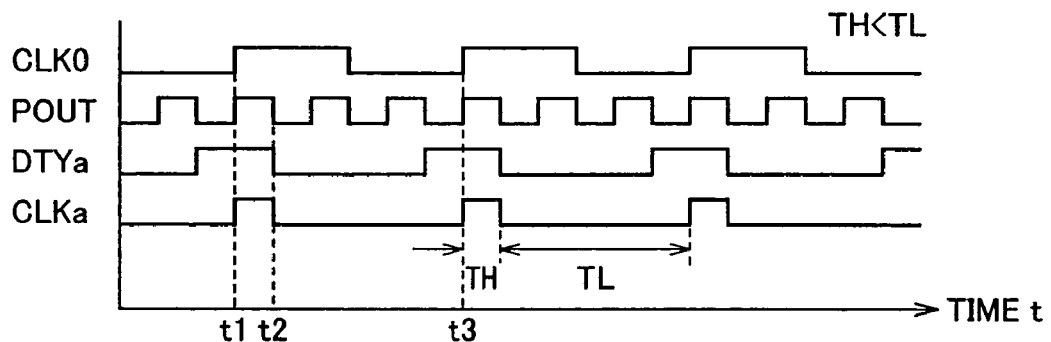
FIG. 20 is an operational waveform diagram illustrating a circuit operation of clock generation circuit 1C in accordance with the third embodiment of the present invention.

FIG. 20 is an operational waveform diagram illustrating a circuit operation of clock generation circuit 1C in accordance with the third embodiment of the present invention.

At time t1, in response to the rising of both of output PLL signal POUT and duty ratio control signal DTYa, clock signal CLKa rises. At time t2, in response to the falling of output PLL signal POUT and duty ratio control signal DTYa, clock signal CLKa falls. Clock signal CLKa keeps falling until both output PLL signal POUT and duty ratio control signal DTYa rise again at time t3.

Therefore, as shown in FIG. 20, clock signal CLKa has the H level period longer than the L level period and has the duty ratio changed from 50%. When duty ratio control signal DTYa has the same frequency as reference clock signal CLK0, clock signal CLKa has the same frequency as reference clock signal CLK0. The duty ratio of clock signal CLKa can be adjusted by changing the frequency multiplication rate between reference clock signal CLK0 and output PLL signal POUT from three times.

Figure 21:
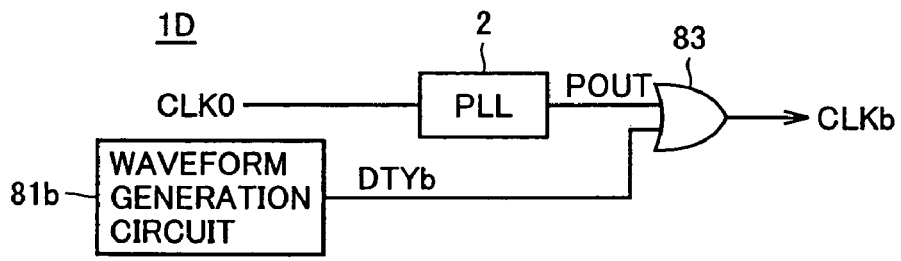
FIG. 21 is a circuit diagram showing a circuit configuration of a clock generation circuit 1D in accordance with the third embodiment of the present invention.

FIG. 21 is a circuit diagram showing a circuit configuration of a clock generation circuit 1D in accordance with the third embodiment of the present invention.

Clock generation circuit 1D of the third embodiment shown in FIG. 21 includes a PLL circuit 2, a waveform generation circuit 81d, and an OR gate 83.

PLL circuit 2 receives the input of reference clock signal CLK0 and outputs output PLL signal POUT that is three times the frequency of reference clock signal CLK0. It is noted that PLL circuit 2 may be an analog PLL circuit, a digital PLL circuit, or any other PLL circuit, and that three times is only an example, and basically, any multiplication rate may be employed. Waveform generation circuit 81b outputs a duty ratio control signal DTYb. OR gate 83 receives the inputs of output PLL signal POUT and duty ratio control signal DTYb to output a clock signal CLKb.

Duty ratio control signal DTYb is a periodic signal having a waveform generated by waveform generation circuit 81b such that the period of time during which output PLL signal POUT and duty ratio control signal DTYb both are at L level is different from the other period of time.

Figure 22:
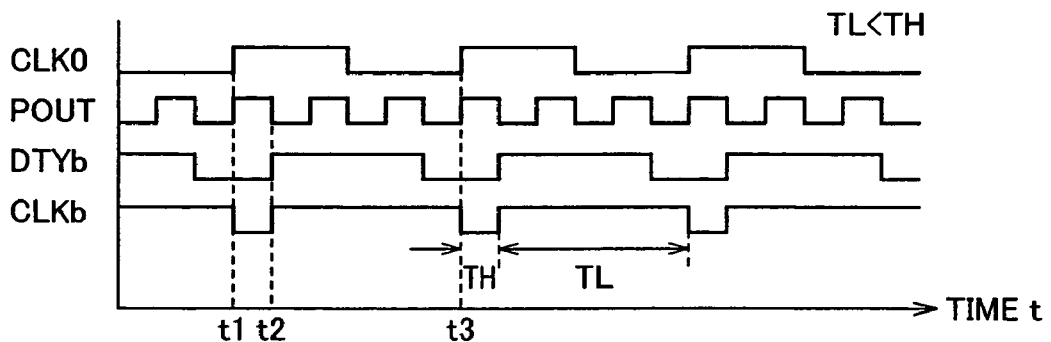
FIG. 22 is an operational waveform diagram illustrating a circuit operation of clock generation circuit 1D in accordance with the third embodiment of the present invention.

FIG. 22 is an operational waveform diagram illustrating a circuit operation of clock generation circuit 1D in accordance with the third embodiment of the present invention.

At time t1, in response to the falling of both output PLL signal POUT and duty ratio control signal DTYb, clock signal CLKb falls. At time t2, in response to the rising of output PLL signal POUT, clock signal CLKb rises. Thereafter, clock signal CLKb keeps rising until both output PLL signal POUT and duty ratio control signal DTYb fall again at time t3.

Therefore, as shown in FIG. 22, clock signal CLKb has an H level period longer than an L level period and has its duty ratio changed from 50%. Furthermore, when duty ratio control signal DTYb has the same frequency as reference clock signal CLK0, clock signal CLKb has the same frequency as reference clock signal CLK0. The duty ratio of clock signal CLKb can be adjusted by changing the frequency multiplication rate between reference clock signal CLK0 and output PLL signal POUT from three times.

As described above, in accordance with the third embodiment, increased speed and reduced power of the system including the clock generation circuit can be realized by using the waveform generation circuit to change the duty ratio of the clock signal output from the clock generation circuit.

[Fourth Embodiment]

Exemplary configurations of a system including at least one of clock generation circuits 1A–1D of the first to third embodiments will now be described.

Figure 23:
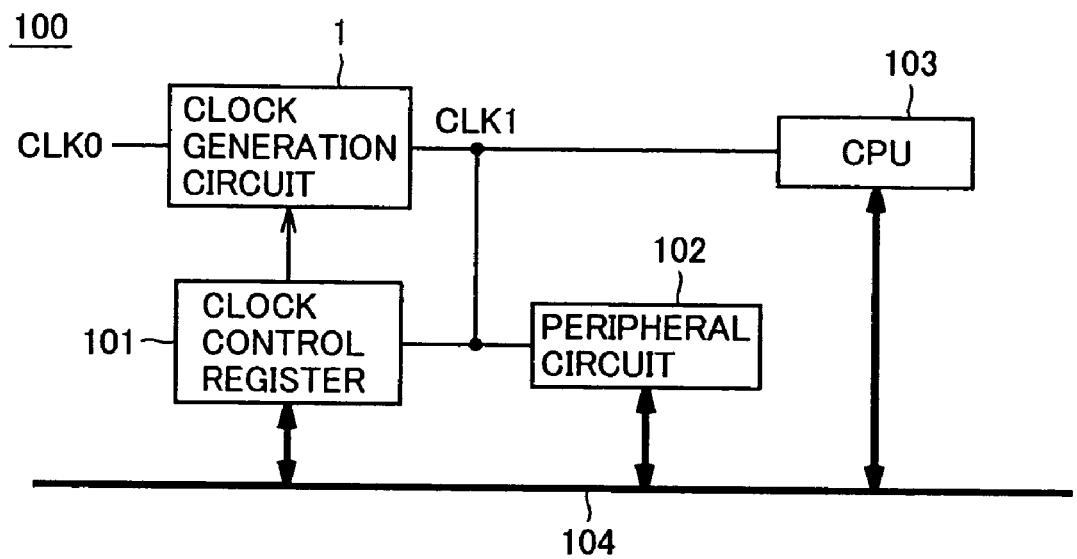
FIG. 23 is a block diagram showing a configuration of a system 100 in accordance with a fourth embodiment of the present invention.

FIG. 23 is a block diagram showing a configuration of a system 100 in accordance with a fourth embodiment of the present invention.

System 100 of the fourth embodiment shown in FIG. 23 includes a clock generation circuit 1, a clock control register 101, a peripheral circuit 102, a CPU (Central Processing Unit) 103, and a CPU bus 104.

Clock generation circuit 1 is any of clock generation circuits 1A-1D of the first to third embodiments of the present invention, which receives reference clock signal CLK0 to output clock signal CLK to peripheral circuit 102 and CPU 103. Clock generation circuit 1 is controlled by an instruction from CPU 103. The duty ratio of clock signal CLK and the on/off of the duty ratio control can be controlled by one or more control signals output from clock control register 101.

Here, the control signal refers to driving capability control signals DRVP, DRVN in buffer circuit 10b of the first embodiment, timing control signals TMGP, TMGN in buffer circuit 10d of the first embodiment, delay control signal DLY in buffer circuits 10f, 10g of the first embodiment, count value control signal PCNT in PLL circuit 2A of the second embodiment, selector control signal PSEL in PLL circuit 2A of the second embodiment, duty ratio control signals DTYa, DTYb in clock generation circuits 1C, 1D of the third embodiment, or the like.

Clock control register 101 can perform reading/writing of a register value from/to CPU 103 through CPU bus 104. Therefore, the register value held in clock control register 101 is mapped to an address space in CPU 103.

Peripheral circuit 102 can be controlled by CPU 103 through CPU bus 104 and communicate signals with clock generation circuit 1 and dock control register 101. Peripheral circuit 102 may be a circuit assisting in the operation of system 100, a circuit receiving clock signal CLK for its operation, or a circuit such as a current measuring circuit or a temperature measuring circuit.

When peripheral circuit 102 is a current measuring circuit, an amount of current in a circuit operated with clock signal CLK is measured with the duty ratio of clock signal CLK gradually varied, and the duty ratio at which the amount of current is minimum is determined as the duty ratio of clock signal CLK, so that an optimum duty ratio of clock signal CLK can be set.

When peripheral circuit 102 is a temperature measuring circuit, a temperature of a circuit operated with clock signal CLK is measured with the duty ratio of clock signal CLK gradually varied, and the duty ratio at which the temperature is lowest is determined as the duty ratio of clock signal CLK, so that an optimum duty ratio of dock signal CLK can be set.

CPU 103 controls the entire system 100 by controlling clock generation circuit 1, clock control register 101, and peripheral circuit 102 directly or through CPU bus 104. In this manner, in system 100 of the fourth embodiment, the duty ratio of clock signal CLK can be controlled by software.

Figure 24:
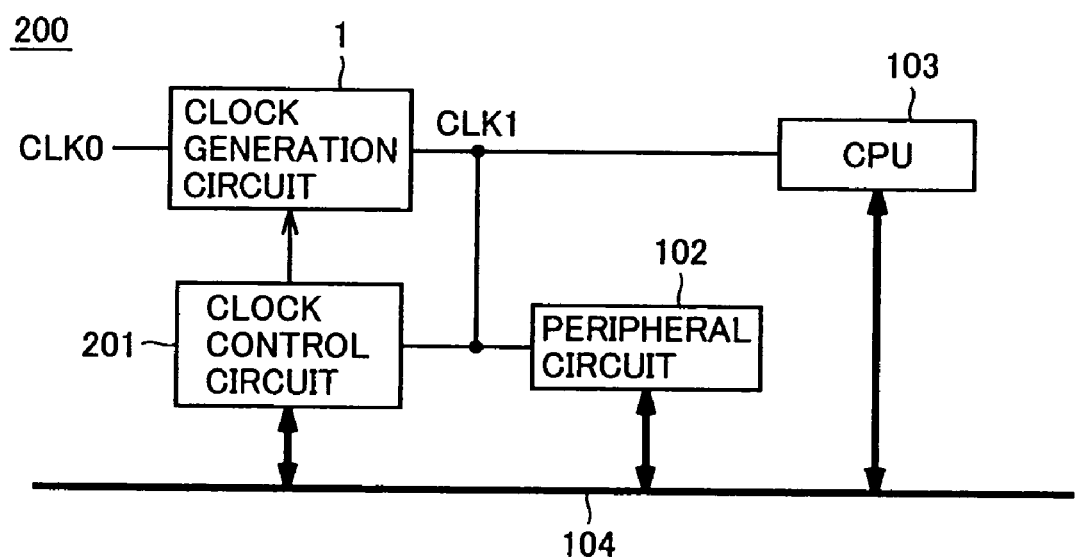
FIG. 24 is a block diagram showing a configuration of a system 200 in accordance with the fourth embodiment of the present invention.

FIG. 24 is a block diagram showing a configuration of a system 200 in accordance with the fourth embodiment of the present invention.

System 200 of the fourth embodiment shown in FIG. 24 differs from system 100 in that clock control register 101 is replaced with a clock control circuit 201. Therefore, the description of the same components as system 100 will not be repeated here.

Clock control circuit 201 is a dedicated control circuit controlling clock generation circuit 1 and is controlled by CPU 103 through CPU bus 104. The control of the duty ratio of dock signal CLK or the on/off of the duty ratio control is performed by one or more control signals output from clock control circuit 201.

Here, the control signal refers, for example, to driving capability control signals DRVP, DRVN, timing control signals TMGP, TMGN, delay control signal DLY, count value control signal PCNT, selector control signal PSEL, duty ratio control signals DTYa, DTYb, or the like, as in system 100.

In this manner, in system 200 of the fourth embodiment, the duty ratio of clock signal CLK can be controlled by software.

In systems 100, 200 of the fourth embodiment, CPU 103 is operated with clock signal CLK from clock generation circuit 1 that is indirectly controlled by CPU 103. Such a system configuration, however, is only shown by way of example, and CPU 103 may be operated with a clock signal from another clock generation circuit.

Figure 25:
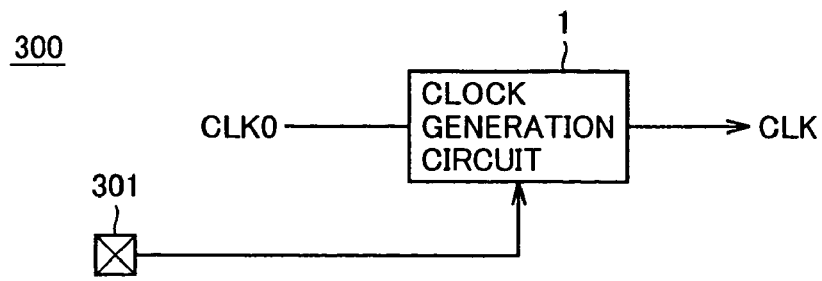
FIG. 25 is a block diagram showing a configuration of a system 300 in accordance with the fourth embodiment of the present invention.

FIG. 25 is a block diagram showing a configuration of a system 300 in accordance with the fourth embodiment of the present invention.

System 300 of the fourth embodiment shown in FIG. 25 includes clock generation circuit 1 and an external terminal 301.

Clock generation circuit 1 is any of clock generation circuits 1A–1D of the first to third embodiments of the present invention, which receives reference clock signal CLK0 to output clock signal CLK. System 300 can perform the control of duty ratio of clock signal CLK or the on/off of the duty ratio control using one or more control signals directly input from external terminal, or one or more control signals generated through an operation on the input from external terminal 301.

Here, as in system 100, the control signal refers, for example, to driving capability control signals DRVP, DRVN, timing control signals TMGP, TMGN, delay control signal DLY, a count value control signal PCNT, selector control signal PSEL, duty ratio control signals DTYa, DTYb, or the like.

An external ammeter may be connected to external terminal 301 to measure a power consumption of a circuit operated with clock signal CLK with the duty ratio of clock signal varied gradually, and the duty ratio at which the power consumption is minimum is employed as the duty ratio of clock signal CLK, so that an optimum duty ratio of clock signal CLK can be set.

Alternatively, an external thermometer may be connected to external terminal 301 to measure a temperature of a circuit operated with clock signal CLK with the duty ratio of clock signal CLK varied gradually, and the duty ratio at which the temperature is lowest is determined as the duty ratio of clock signal CLK, so that an optimum duty ratio of clock signal CLK can be set.

In this manner, in system 300 of the fourth embodiment, the duty ratio of clock signal CLK can be determined, for example, depending on the system in use, by controlling clock generation circuit 1 with the input from external terminal 301. In addition, the duty ratio of clock signal CLK can be controlled by an external different system or control circuit.

Figure 26:
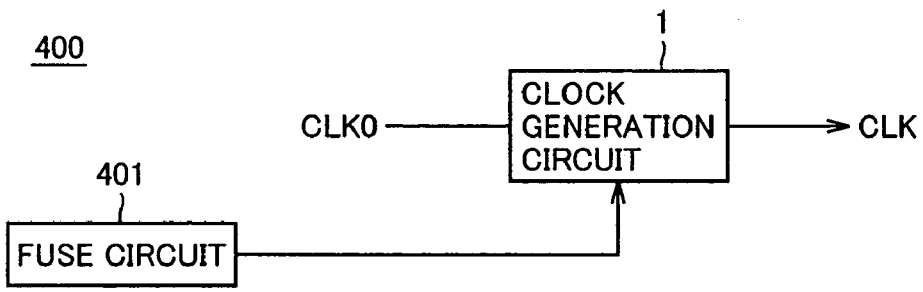
FIG. 26 is a block diagram showing a configuration of a system 400 in accordance with the fourth embodiment of the present invention.

FIG. 26 is a block diagram showing a configuration of a system 400 in accordance with the fourth embodiment of the present invention.

System 400 of the fourth embodiment shown in FIG. 26 includes clock generation circuit 1 and a fuse circuit 401.

Clock generation circuit 1 is any of clock generation circuits 1A–1D of the first to third embodiments of the present invention, which receives reference clock signal CLK0 to output clock signal CLK. System 400 can control the duty ratio of clock signal CLK or the on/off of the duty ratio control using one or more control signals from fuse circuit 401. Fuse circuit 401 sets the control signal, for example, using a technique such as laser trimming.

Here, as in system 100, the control signal refers, for example, to driving capability control signals DRVP, DRVN, timing control signals TMGP, TMGN, delay control signal DLY, count value control signal PCNT, selector control signal PSEL, duty ratio control signals DTYa, DTYb, or the like.

In this manner, clock generation circuit 1 is controlled by fuse circuit 401. Therefore, where system 400 is incorporated into an LSI, for example, the characteristics of LSI is evaluated in a manufacturing test and the duty ratio of clock signal CLK can be determined based on the test result.

Figure 27:
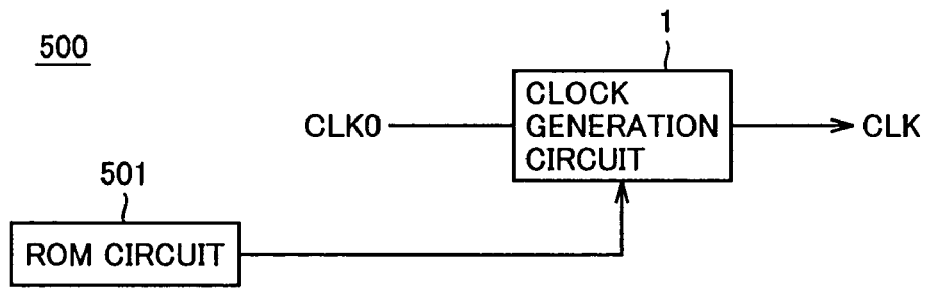
FIG. 27 is a block diagram showing a configuration of a system 500 in accordance with the fourth embodiment of the present invention.

FIG. 27 is a block diagram showing a configuration of a system 500 in accordance with the fourth embodiment of the present invention.

System 500 of the fourth embodiment shown in FIG. 27 includes clock generation circuit 1 and an ROM (Read Only Memory) circuit 501.

Clock generation circuit 1 is any of clock generation circuits 1A–1D of the first to third embodiments of the present invention, which receives reference clock signal CLK0 to output clock signal CLK. System 500 can control the duty ratio of clock signal CLK or the on/off of the duty ratio control using one or more control signals from ROM circuit 501.

Here, as in system 100, the control signal refers, for example, to driving capability control signals DRVP, DRVN, timing control signals TMGP, TMGN, delay control signal DLY, count value control signal PCNT, selector control signal PSEL, duty ratio control signals DTYa, DTYb, or the like.

ROM circuit 401 may be, for example, a mask ROM, a PROM (Programmable ROM), an EPROM (Electrically Programmable ROM), or a EEPROM (Electrically Erasable and Programmable ROM) such as a flash memory. An optimum duty ratio of clock signal CLK can thus be determined depending on the system in use, by controlling clock generation circuit 1 by ROM circuit 501.

Figure 28:
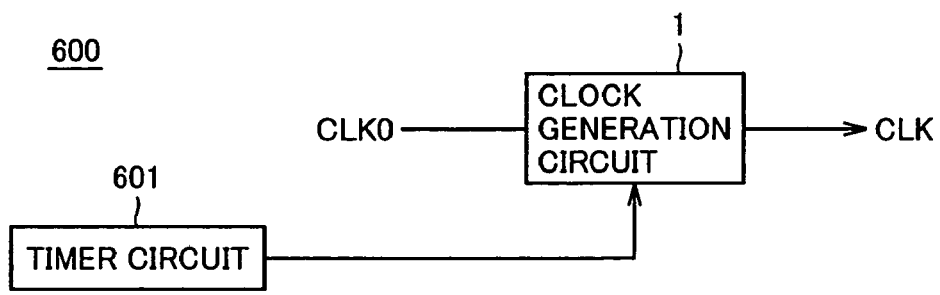
FIG. 28 is a block diagram showing a configuration of a system 600 in accordance with the fourth embodiment of the present invention.

FIG. 28 is a block diagram showing a configuration of a system 600 in accordance with the fourth embodiment of the present invention.

System 600 of the fourth embodiment shown in FIG. 28 includes clock generation circuit 1 and a timer circuit 601.

Clock generation circuit 1 is any of clock generation circuits 1A–1D of the first to third embodiments, which receives reference clock signal CLK0 to output clock signal CLK. System 600 can control the duty ratio of clock signal CLK or the on/off of the duty ratio control using one or more control signals form timer circuit 601.

Here, as in system 100, the control signal refers, for example, to driving capability control signals DRVP, DRVN, timing control signals TMGP, TMGN, delay control signal DLY, count value control signal PCNT, selector control signal PSEL, duty ratio control signals DTYa, DTYb, or the like.

Timer circuit 601 may be dedicated to clock generation circuit 1. Alternatively, where system 600 is integrated with a system LSI, it may be shared with a peripheral circuit or may be at a CPU in the system LSI to measure the number of cycles.

In this manner, clock generation circuit 1 is controlled by timer circuit 601 to allow the duty ratio of clock signal CLK to be varied every certain times or every certain cycles, so that the duty ratio of clock signal CLK can be controlled.

As an example of the system in the fourth embodiment of the present invention, systems 100–600 shown in FIGS. 23–28 may be combined. Referring to FIG. 23, assume that peripheral circuit 102 is a composite circuit including external terminal 301 of system 300, fuse circuit 401 of system 400, ROM circuit 501 of system 500, timer 601 of system 600, and a circuit receiving clock signal CLK to operate.

In this case, the duty ratio of clock signal CLK can be set individually for clock control register 101, external terminal 301, fuse circuit 401, ROM circuit 501, and timer circuit 601. During the operation of the circuit receiving clock signal CLK for operation, the duty ratio of clock signal CLK can be finely adjusted for each of clock control register 101, external terminal 301, fuse circuit 401, ROM circuit 501, and timer circuit 601, from CPU 103. It is noted that clock control register 101 may be replaced with clock control circuit 201 of system 200.

As another example of the system in the fourth embodiment of the present invention, systems 100–600 shown in FIGS. 23–28 may be selectively used depending on the modules included in LSI. Referring to FIG. 23, assume that peripheral circuit 102 is a composite circuit including external terminal 301 of system 300, fuse circuit 401 of system 400, ROM circuit 501 of system 500, timer circuit 601 of system 600, and a circuit divided into a plurality of modules receiving clock CLK for operation.

In this case, depending on each module of the circuit receiving clock signal CLK for operation, clock control register 101, external terminal 301, fuse circuit 401, ROM circuit 501, and timer circuit 601 is selected as appropriate, so that an optimum duty ratio of clock signal CLK can be set for each module. As a result, a more optimum system can be realized as a whole. It is noted that clock control register 101 may be replaced with clock control circuit 201 of system 200.

Referring to FIG. 23, when peripheral circuit 102 includes a circuit divided into a plurality of modules receiving clock signal CLK for operation, an optimum duty ratio of clock signal CLK can be determined and changed for a plurality of modules as a whole, or may be determined and changed for each module.

If an optimum duty ratio of clock signal CLK is measured and changed for the modules as a whole, only a single circuit is required as a measurement circuit, a duty ratio changing circuit, and the like, thereby simplifying the circuit structure. If an optimum duty ratio of clock signal is determined and changed for each module, a respective circuit is required as a measurement circuit, a duty ratio changing circuit, and the like, thereby complicating the circuit structure, although the optimum duty ratio of clock signal CLK can be determined and changed more flexibly.

Next, referring to FIG. 23, assume that peripheral circuit 102 includes a circuit divided into a plurality of modules receiving clock signal CLK for operation and that clock signal CLK output from clock generation circuit 1 is supplied not only to the inside but also to the outside of system 100.

In this case, it is possible, for example, to set the duty ratio of clock signal CLK to be supplied to the outside of system 100 at 50% and to set only the duty ratio of clock signal CLK to be supplied to each module inside system 100, individually. Because of such duty ratio setting, it is possible to avoid the risk of malfunction of a particular module inside system 100 due to the difference in duty ratio of clock signal CLK. It is also possible to avoid the risk of reducing performance of a particular module inside system 100 due to the difference in duty ratio of clock signal CLK.

In addition, because of the duty ratio setting as described above, the duty ratio is properly shifted from system 100 to another LSI on the system, resulting in the shifted operation timings between them. Therefore, the timings of current peak are shifted from each other, thereby reducing the possibility of the malfunction of system 100 due to over-current, and reducing the noise due to EMI and the like.

As described above, in accordance with the fourth embodiment, the performance of the system can be improved by constructing the system including clock generation circuits 1A–1D of the first to third embodiments of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generation circuit comprising:
   a frequency-multiplying circuit receiving an input of a reference clock signal and outputting a same or frequency-multiplied clock signal of said reference clock signal; and
   a buffering portion buffering said output clock signal, wherein
   said buffering portion includes at least one buffer circuit buffering said output clock signal such that a logic low period and a logic high period of said output clock signal are different from each other, and the difference between the logic low period and the logic high period of said output clock signal is maintained under a predetermined level of a control signal, wherein at least one of a power supply potential or a ground potential in said buffer circuit is different from another power supply voltage or ground voltage, respectively, in said buffering portion.

2. A clock generation circuit comprising:

a frequency-multiplying circuit receiving an input of a reference clock signal and outputting a same or frequency-multiplied clock signal of said reference clock signal; and a buffering portion buffering said output clock signal, wherein said buffering portion includes at least one buffer circuit buffering said output clock signal such that a logic low period and a logic high period of said output clock signal are different from each other, and the difference between the logic low period and the logic high period of said output clock signal is maintained under a predetermined level of a control signal, wherein a substrate potential of a transistor included in said buffer circuit is different from a substrate potential of another transistor included in said buffering portion.

3. A clock generation circuit comprising:

a frequency-multiplying circuit receiving an input of a reference clock signal and outputting a same or frequency-multiplied clock signal of said reference clock signal, said output clock signal having a logic high period and a logic low period different from each other; and a buffering portion buffering said output clock signal, wherein said frequency-multiplied circuit includes a ring oscillator, a comparator comparing a phase of said output clock signal output from said ring oscillator with a phase of said reference clock signal, a counter determining a digital count value based on a phase comparison result output from said comparator, and a control circuit incrementing/decrementing said digital count value in response to a rising/falling of said reference clock signal, said ring oscillator including a delay line varying a delay time in accordance with said digital count value.

4. A clock generation circuit comprising:

a frequency-multiplying circuit receiving an input of a reference clock signal and outputting a same or frequency-multiplied clock signal of said reference clock signal, said output clock signal having a logic high period and a logic low period different from each other, the difference between the logic high period and the logic low period being maintained under a predetermined level of a control signal; and a buffering portion buffering said output clock signal, wherein said frequency-multiplying circuit includes a ring oscillator, a comparator comparing a phase of said output clock signal output from said ring oscillator with a phase of said reference clock signal, and a counter determining a digital count value based on a phase comparison result output from said comparator, said ring oscillator including first and second delay lines connected in series for receiving said digital count value for determining a delay time, and a selector selecting and outputting an input from one of said first and second delay lines in accordance with said output clock signal.

5. A clock generation circuit comprising:

a frequency-multiplying circuit receiving an input of a reference clock signal and outputting a same or frequency-multiplied clock signal of said reference clock signal;

a waveform generation circuit outputting a duty ratio control signal; and an AND gate receiving said output clock signal and said duty ratio control signal, wherein in said duty ratio control signal, a period of time during which both of said output clock signal and said duty ratio control signal are logic high is different from the other period of time.

6. A clock generation circuit comprising:

a frequency-multiplying circuit receiving an input of a reference clock signal and outputting a same or frequency-multiplied clock signal of said reference clock signal;

a waveform generation circuit outputting a duty ratio control signal; and an OR gate receiving said output clock signal and said duty ratio control signal, wherein in said duty ratio control signal, a period of time during which both of said output clock signal and said duty ratio control signal are logic low is different from the other period of time.

7. A clock generation circuit comprising:

a frequency-multiplying circuit receiving an input of a reference clock signal and outputting a same or frequency-multiplied clock signal of said reference clock signal; and a buffering portion buffering said output clock signal, wherein said buffering portion includes at least one buffer circuit for changing a duty ratio of said output clock signal, wherein said buffer circuit includes a first inverter circuit receiving said output clock signal, and a second inverter circuit receiving an output of said first inverter circuit, one of said first and second inverter circuits including a plurality of first transistors connected in parallel between a power supply node and an output node and having one polarity, a plurality of second transistors connected in parallel between said output node and a ground node and having the other polarity, and a driving capability control portion controlling on/off of said plurality of first and second transistors respectively using a plurality of driving capability control signals.

8. A clock generation circuit comprising:

a frequency-multiplying circuit receiving an input of a reference clock signal and outputting a same or frequency-multiplied clock signal of said reference clock signal; and a buffering portion buffering said output clock signal, wherein said buffering portion includes at least one buffer circuit for changing a duty ratio of said output clock signal, wherein said buffer circuit includes a first inverter circuit receiving said output clock signal, a second inverter circuit receiving an output of said first inverter circuit, and a timing control portion controlling rising or falling timing of a signal level output from said first inverter circuit to said second inverter circuit using a plurality of timing control signals.

9. A clock generation circuit comprising:

a frequency-multiplying circuit receiving an input of a reference clock signal and outputting a same or frequency-multiplied clock signal of said reference clock signal; and a buffering portion buffering said output clock signal, wherein said buffering portion includes at least one buffer circuit for changing a duty ratio of said output clock signal and maintaining that duty ratio of said output clock signal under a predetermined level of a first control signal, wherein at least one of a power supply potential and a ground potential of said buffer circuit varies using a second control signal.

10. A clock generation circuit comprising:

a frequency-multiplying circuit receiving an input of a reference clock signal and outputting a same or frequency-multiplied clock signal of said reference clock signal; and a buffering portion buffering said output clock signal, wherein said buffering portion includes at least one buffer circuit for changing a duty ratio of said output clock signal and maintaining that duty ratio of said output clock signal under a predetermined level of a first control signal, wherein a substrate potential of a transistor included in said buffer circuit varies using a second control signal.

11. A clock generation circuit comprising:

a frequency-multiplying circuit receiving an input of a reference clock signal and outputting a same or frequency-multiplied clock signal of said reference clock signal; and a buffering portion buffering said output clock signal, wherein said buffering portion includes at least one buffer circuit for changing a duty ratio of said output clock signal, said buffer circuit comprises a delay circuit capable of controlling a delay time using a delay control signal; and a logic element receiving an output signal from said delay circuit and the, reference clock signal for outputting a clock signal.

12. The clock generation circuit according to claim 11 wherein said logic element is an AND gate.

13. The clock generation circuit according to claim 11 wherein said logic element is an OR gate.

14. A clock generation circuit comprising:

a frequency-multiplying circuit receiving an input of a reference clock signal and outputting a same or frequency-multiplied clock signal of said reference clock signal; and a buffering portion buffering said output clock signal, wherein said frequency-multiplying circuit is configured for changing a duty ratio of said output clock signal, wherein said frequency-multiplying circuit includes a ring oscillator, a comparator comparing a phase of said clock signal output from said ring oscillator with a phase of said reference clock signal, a counter determining a digital count value based on a phase comparison result output from said comparator, and a control circuit incrementing/decrementing said digital count value in accordance with a rising/falling of said reference clock signal when a count value control signal has a prescribed value, said ring oscillator including a delay line varying a delay time in accordance with said digital count value.

15. The clock generation circuit according to claim 14 wherein whether said count value control signal takes said prescribed value is determined in accordance with said digital count value.

16. The clock generation circuit according to claim 14 wherein whether said count value control signal takes said prescribed value is determined in accordance with a frequency of said output clock signal.

17. A clock generation circuit comprising:

a frequency-multiplying circuit receiving an input of a reference clock signal and outputting a same or frequency-multiplied clock signal of said reference clock signal; and a buffering portion buffering said output clock signal, wherein said frequency-multiplying circuit is configured for changing a duty ratio of said output clock signal, wherein said frequency-multiplying circuit includes a ring oscillator, a comparator comparing a phase of said output clock signal output from said ring oscillator with a phase of said reference clock signal, a counter determining a digital count value based on a phase comparison result output from said comparator, and a logic element receiving a selector control signal and said output clock signal for outputting a select signal, said ring oscillator including first and second delay lines connected in series for receiving said digital count value for determining a delay time, and a selector selecting and outputting an input from one of said first and second delay lines in accordance with said select signal.

18. The clock generation circuit according to claim 17 wherein whether said selector control signal takes said prescribed value is determined in accordance with said digital count value.

19. The clock generation circuit according to claim 17 wherein whether said selector control signal takes said prescribed value is determined in accordance with a frequency of said output clock signal.

20. A clock generation circuit comprising:
a frequency-multiplying circuit receiving an input of a reference clock signal and outputting a same or frequency-multiplied clock signal of said reference clock signal;
a waveform generation circuit generatinga duty ratio control signal; and
an AND gate receiving said output clock signal and said duty ratio control signal, wherein
in said duty ratio control signal, a ratio between a period of time during which both of said output clock signal and said duty ratio control signal are logic high and the other period of time varies.

21. A clock generation circuit comprising:
a frequency-multiplying circuit receiving an input of a reference clock signal and outputting a same or frequency-multiplied clock signal of said reference clock signal;
a waveform generation circuit generating a duty ratio control signal; and
an OR gate receiving said output clock signal and said duty ratio control signal, wherein
in said duty ratio control signal, a ratio between a period of time during which both of said output clock signal and said duty ratio control signal are logic low and the other period of time varies.

22. A system comprising:
a clock generation circuit outputting a clock signal;
a clock controlling circuit controlling a duty ratio of said clock signal using a control signal; and
a central processing unit controlling said clock controlling circuit,
said clock generation circuit including
a frequency-multiplying circuit receiving an input of a reference clock signal and outputting said clock signal same as or multiplied in frequency of said reference clock signal, and
a buffering portion buffering said clock signal, wherein
said buffering portion includes at least one buffer circuit for changing a duty ratio of said clock signal,
said system further comprising
a current measurement circuit measuring an operating current of a circuit receiving said clock signal, wherein
said central processing unit controls a duty ratio of said clock signal or on/off of duty ratio control based on a measurement result of said operating current.

23. A system comprising:
a clock generation circuit outputting a clock signal;
a clock controlling circuit controlling a duty ratio of said clock signal using a control signal; and
a central processing unit controlling said clock controlling circuit,
said clock generation circuit including
a frequency-multiplying circuit receiving an input of a reference clock signal and outputting said clock signal same as or multiplied in frequency of said reference clock signal, and
a buffering portion buffering said clock signal, wherein
said frequency-multiplying circuit is configured for changing a duty ratio of said clock signal,
said system further comprising
a current measurement circuit measuring an operating current of a circuit receiving said clock signal, wherein
said central processing unit controls a duty ratio of said clock signal or on/off of duty ratio control based on a measurement result of said operating current.

24. A system comprising:
the clock generation circuit according to claim 20;
a clock controlling circuit controlling a duty ratio of said clock signal using a control signal;
a central processing unit controlling said clock controlling circuit; and
a current measurement circuit measuring an operating current of a circuit receiving said clock signal, wherein
said central processing unit controls a duty ratio of said clock signal or on/off of duty ratio control based on a measurement result of said operating current.

25. A system comprising:
the clock generation circuit according to claim 21;
a clock controlling circuit controlling a duty ratio of said clock signal using a control signal;
a central processing unit controlling said clock controlling circuit; and
a current measurement circuit measuring an operating current of a circuit receiving said clock signal, wherein
said central processing unit controls a duty ratio of said clock signal or on/off of duty ratio control based on a measurement result of said operating current.

26. A system comprising:
a clock generation circuit outputting a clock signal;
a clock controlling circuit controlling a duty ratio of said clock signal using a control signal; and
a central processing unit controlling said clock controlling circuit, said clock generation circuit including
a frequency-multiplying circuit receiving an input of a reference clock signal and outputting said clock signal same as or multiplied in frequency of said reference clock signal, and
a buffering portion buffering said clock signal, wherein
said buffering portion includes at least one buffer circuit for changing a duty ratio of said clock signal,
said system further comprising
a temperature measurement circuit measuring a temperature of a circuit receiving said clock signal, wherein
said central processing unit controls a duty ratio of said clock signal or on/off of duty ratio control based on a measurement result of said temperature.

27. A system comprising:
a clock generation circuit outputting a clock signal;
a clock controlling circuit controlling a duty ratio of said clock signal using a control signal; and
a central processing unit controlling said clock controlling circuit,
said clock generation circuit including
a frequency-multiplying circuit receiving an input of a reference clock signal and outputting said clock signal same as or multiplied in frequency of said reference clock signal, and
a buffering portion buffering said clock signal, wherein
said frequency-multiplying circuit is configured for changing a duty ratio of said clock signal,
said system further comprising
a temperature measurement circuit measuring a temperature of a circuit receiving said clock signal, wherein
said central processing unit controls a duty ratio of said clock signal or on/off of duty ratio control based on a measurement result of said temperature.

28. A system comprising:
the clock generation circuit according to claim 20;
a clock controlling circuit controlling a duty ratio of said clock signal using a control signal;
a central processing unit controlling said clock controlling circuit; and a temperature measurement circuit measuring a temperature of a circuit receiving said clock signal, wherein
said central processing unit controls a duty ratio of said clock signal or on/off of duty ratio control based on a measurement result of said temperature.

29. A system comprising:
the clock generation circuit according to claim 21;
a clock controlling circuit controlling a duty ratio of said clock signal using a control signal;
a central processing unit controlling said clock controlling circuit; and
a temperature measurement circuit measuring a temperature of a circuit receiving said clock signal, wherein
said central processing unit controls a duty ratio of said clock signal or on/off of duty ratio control based on a measurement result of said temperature.

30. A system comprising:
a clock generation circuit outputting a clock signal;
a clock controlling circuit controlling a duty ratio of said clock signal using a control signal; and
a central processing unit controlling said clock controlling circuit,
said clock generation circuit including
a frequency-multiplying circuit receiving an input of a reference clock signal and outputting said clock signal same as or multiplied in frequency of said reference clock signal, and
a buffering portion buffering said clock signal, wherein
said buffering portion includes at least one buffer circuit for changing a duty ratio of said clock signal,
said system further comprising
a module circuit receiving said clock signal for operation, wherein
a duty ratio of said clock signal can be set by an instruction from said central processing unit, individually for said clock signal being supplied to said module circuit and for said clock signal being supplied to a prescribed external circuit.

31. A system comprising:
a clock generation circuit outputting a clock signal;
a clock controlling circuit controlling a duty ratio of said clock signal using a control signal; and
a central processing unit controlling said clock controlling circuit,
said clock generation circuit including
a frequency-multiplying circuit receiving an input of a reference clock signal and outputting said clock signal same as or multiplied in frequency of said reference clock signal, and
a buffering portion buffering said clock signal, wherein
said frequency-multiplying circuit is configured for changing a duty ratio of said clock signal,
said system further comprising
a module circuit receiving said clock signal for operation, wherein
a duty ratio of said clock signal can be set by an instruction from said central processing unit, individually for said clock signal being supplied to said module circuit and for said clock signal being supplied to a prescribed external circuit.

32. A system comprising:
the clock generation circuit according to claim 20;
a clock controlling circuit controlling a duty ratio of said clock signal using a control signal;
a central processing unit controlling said clock controlling circuit; and
a module circuit receiving said clock signal for operation, wherein
a duty ratio of said clock signal can be set by an instruction from said central processing unit, individually for said clock signal being supplied to said module circuit and for said clock signal being supplied to a prescribed external circuit.

33. A system comprising:
the clock generation circuit according to claim 21;
a clock controlling circuit controlling a duty ratio of said output clock signal using a control signal;
a central processing unit controlling said clock controlling circuit; and
a module circuit.receiving said output clock signal for operation, wherein
a duty ratio of said output clock signal can be set by an instruction from said central processing unit, individually for said output clock signal being supplied to said module circuit and for said output clock signal being supplied to a prescribed external circuit.

34. A clock generation circuit comprising:
a frequency-multiplying circuit receiving an input of a reference clock signal and outputting a same or frequency-multiplied clock signal of said reference clock signal; and
a buffering portion buffering said output clock signal, wherein
said buffering portion includes at least one buffer circuit for changing a duty ratio of said output clock signal, wherein
said frequency-multiplying circuit includes
a ring oscillator,
a comparator comparing a phase of said output clock signal output from said ring oscillator with a phase of said reference clock signal,
a counter determining a digital count value based on a phase comparison result output from said comparator, and
a control circuit incrementing/decrementing said digital count value in accordance with a rising/falling of said reference clock signal when a count value control signal has a prescribed value
said ring oscillator including a delay line varying a delay time in accordance with said digital count value.

35. The clock generation circuit according to claim 7, further comprising a clock control register controlling on/off of duty ratio control of said output clock signal.

36. The clock generation circuit according to claim 8, further comprising a clock control register controlling on/off of duty ratio control of said output clock signal.

37. The clock generation circuit according to claim 9, further comprising a clock control register controlling on/off of duty ratio control of said output clock signal.

38. The clock generation circuit according to claim 11, further comprising a clock control register controlling on/off of duty ratio control of said output clock signal.

39. The clock generation circuit according to claim 11, further comprising a clock control register controlling on/off of duty ratio control of said output clock signal.

* * * * *